United States Patent
Craig et al.

(10) Patent No.: US 9,399,981 B2
(45) Date of Patent: *Jul. 26, 2016

(54) METHODS AND SYSTEMS FOR COMPARING VERTICAL AXIS TURBINE ARRAYS AND PROVIDING CONFIGURATIONS THEREOF

(71) Applicant: CALIFORNIA INSTITUTE OF TECHNOLOGY, Pasadena, CA (US)

(72) Inventors: Anna Craig, Menlo Park, CA (US); John Oluseun Dabiri, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 14/576,138

(22) Filed: Dec. 18, 2014

(65) Prior Publication Data

US 2015/0106071 A1   Apr. 16, 2015

Related U.S. Application Data

(62) Division of application No. 13/572,611, filed on Aug. 10, 2012, now Pat. No. 8,949,097.

(60) Provisional application No. 61/523,164, filed on Aug. 12, 2011.

(51) Int. Cl.
| | |
|---|---|
| G06G 7/50 | (2006.01) |
| F03D 3/00 | (2006.01) |
| F03G 7/00 | (2006.01) |
| G06F 17/18 | (2006.01) |
| G06F 17/50 | (2006.01) |

(52) U.S. Cl.
CPC ..... *F03D 3/005* (2013.01); *F03G 7/00* (2013.01); *G06F 17/18* (2013.01); *G06F 17/5009* (2013.01)

(58) Field of Classification Search
CPC .......................................... F03G 7/00
USPC .................................................. 703/9
See application file for complete search history.

(56) References Cited

U.S. PATENT DOCUMENTS

| | | | | |
|---|---|---|---|---|
| 8,545,168 B2 * | 10/2013 | Dabiri | ........... | F03D 9/00 415/4.2 |
| 8,949,097 B2 * | 2/2015 | Craig | ........... | F03G 7/00 703/9 |

OTHER PUBLICATIONS

Whittlesey et al. (including one inventor): Fish schooling as a basis for vertical axis wind turbine farm design; arXiv: 1002. 2250 v1 [physics.flu-dyn]; Feb. 2010; pp. 1-16.*
Gonzalez et al.: Optimization of wind farm turbines layout using an evolutive algorithm; Renewable Energy 35 (2010) 1671-1681.*

(Continued)

*Primary Examiner* — Hugh Jones
(74) *Attorney, Agent, or Firm* — Steinfl & Bruno LLP

(57) ABSTRACT

A method for providing potential flow elements including a vortex to capture rotation of a turbine, a dipole to capture a blockage effect of the turbine, a sink to capture extracted energy from wind by the turbine, and a source to capture recovery of flow due to inflow from around the turbine is described. Methods for providing configurations of a VAWT array based on a desired attribute of the array, using a low-order model when the array is subject to physical constraints are also described.

11 Claims, 28 Drawing Sheets

(56) References Cited

OTHER PUBLICATIONS

Calaf et al. (Large eddy simulation study of fully developed wind-turbine array boundary layers); Physics of Fluids 22, 015110; 2010; 16 pp.*

Manwell: Wind Energy Explained: Theory, Design and Application; John Wiley & Sons; 2009; p. 53.*

Dabiri Jo (2010) "A new approach to wind energy," Powerpoint Presentation (Dec. 2010 update); h##p://dabiri.caltech.edu/publications/FLOWE_PPT_; 69 pp., (pages not numbered).*

Homicz: Numerical Simulation of VAWT Stochastic Aerodynamic Loads Produced by Atmospheric Turbulence: VAWT-SAL Code; Sandia Report; SAND91-1124 o UC-261; 1991; 73 pp.*

Emami et al.: New approach on optimization in placement of wind turbines within wind farm by genetic algorithms; Renewable Energy 35 (2010) pp. 1559-1564.*

Grady et al.: Placement of wind turbines using genetic algorithms; Renewable Energy 30 (2005) 259-270.*

Non-Final Office Action mailed on Jun. 25, 2015 for U.S. Appl. No. 14/576,145 filed Dec. 18, 2014 in the name of California Institute of Technology.

* cited by examiner

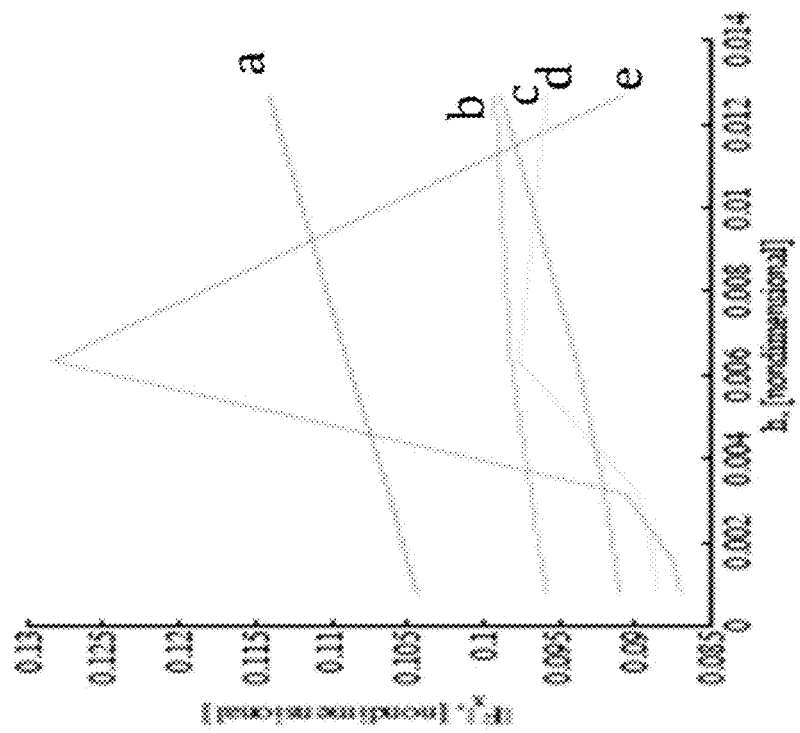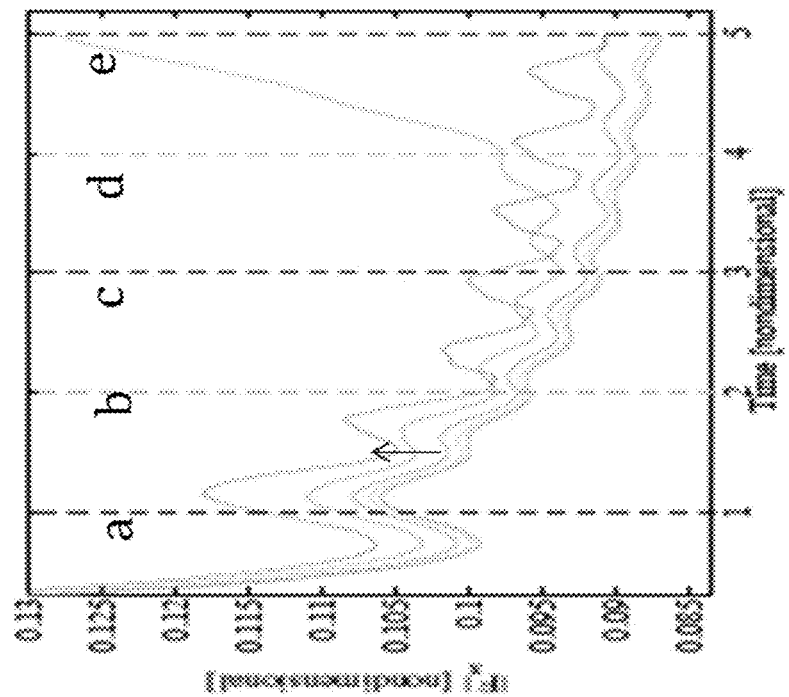
FIG. 3A
FIG. 3B

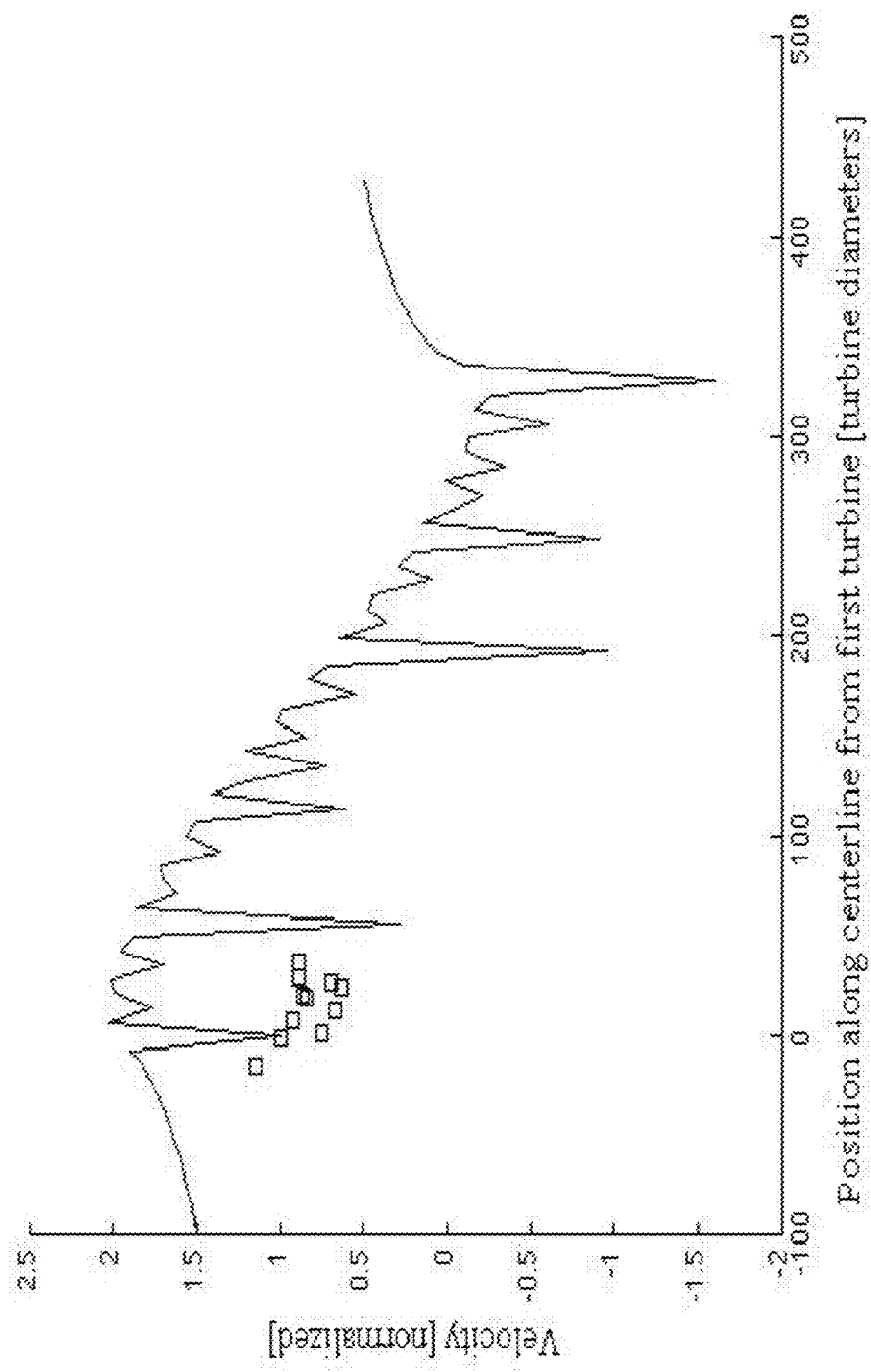

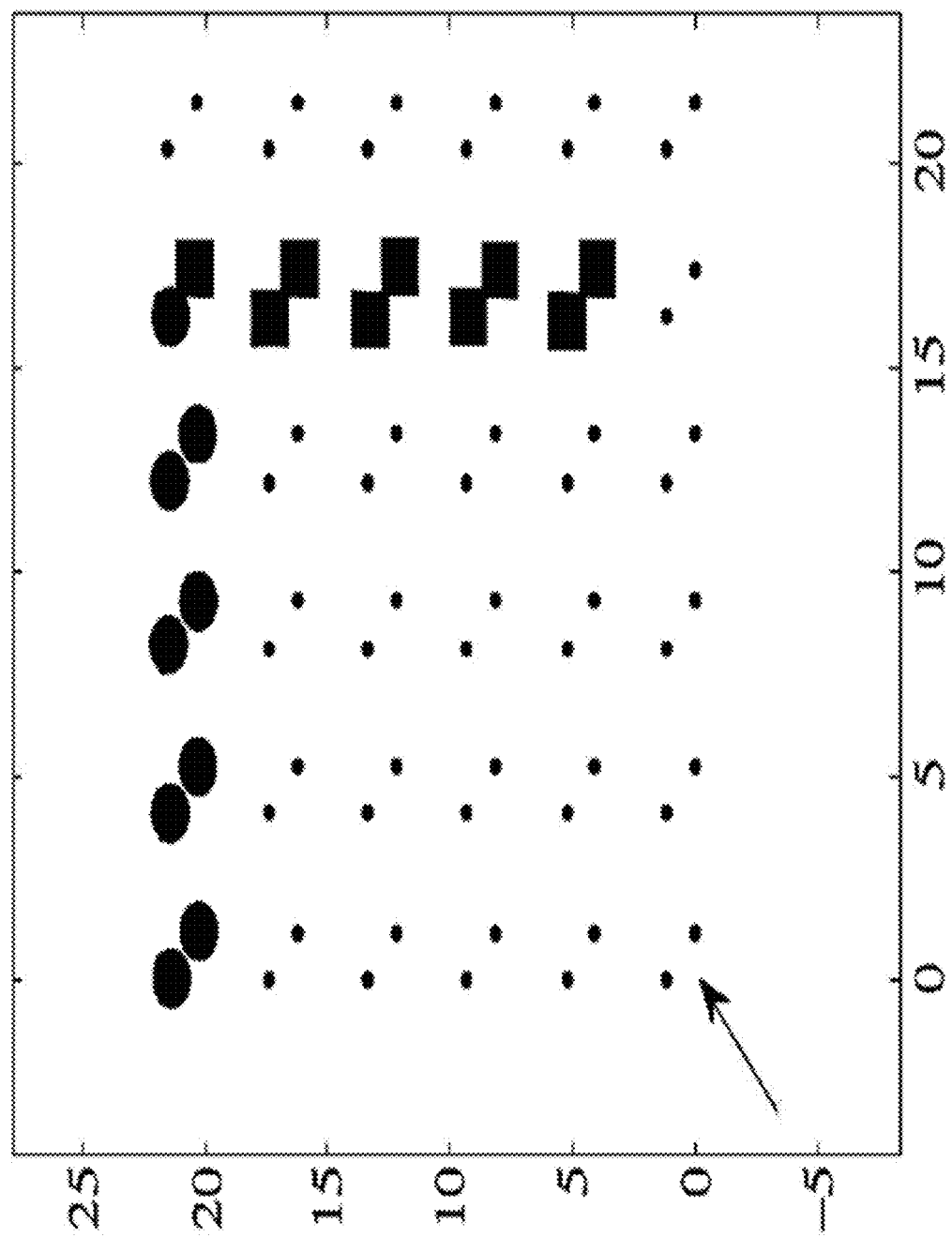

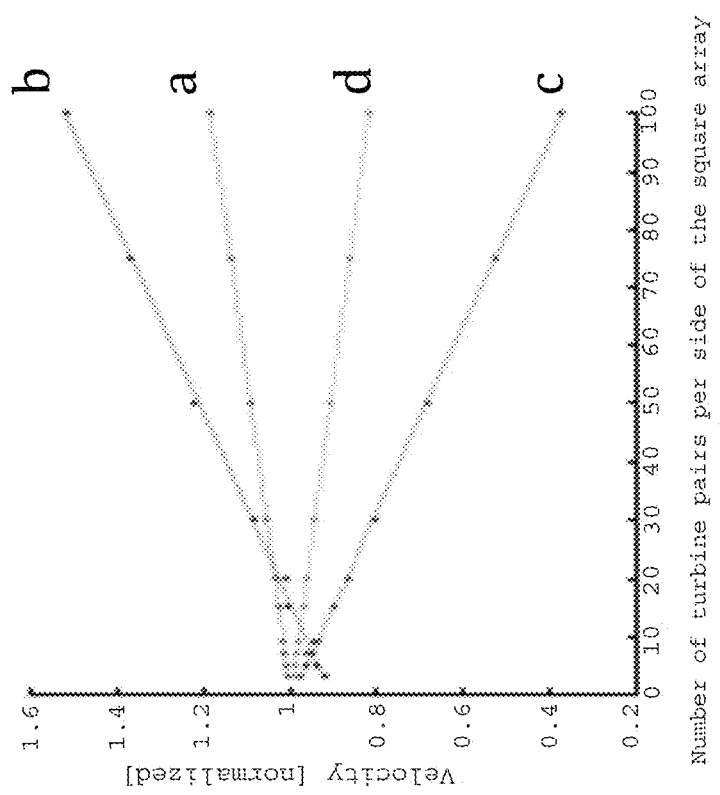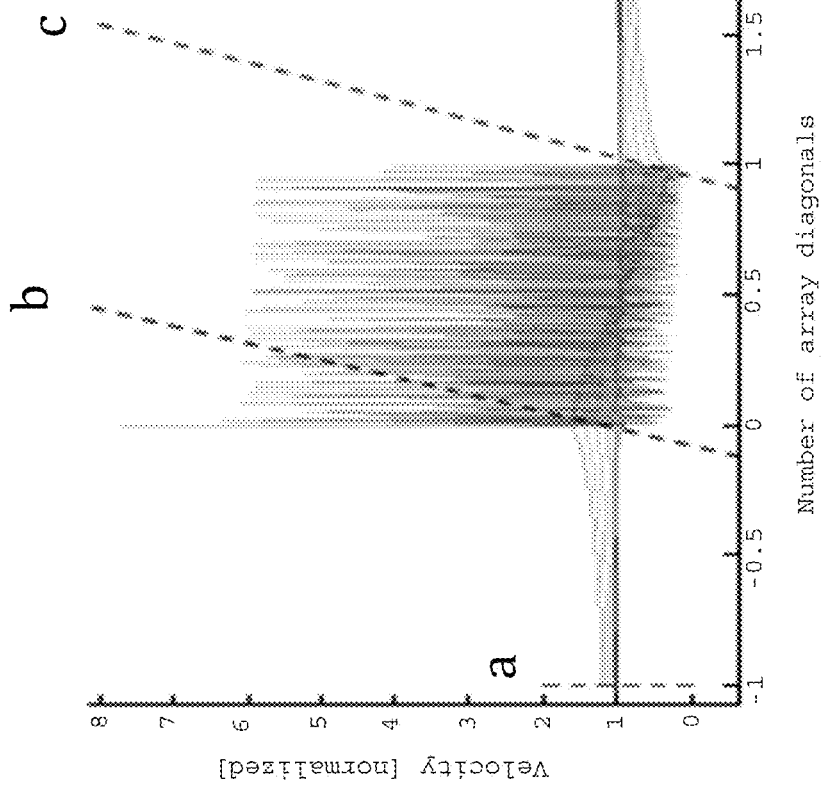
FIG. 13A
FIG. 13B

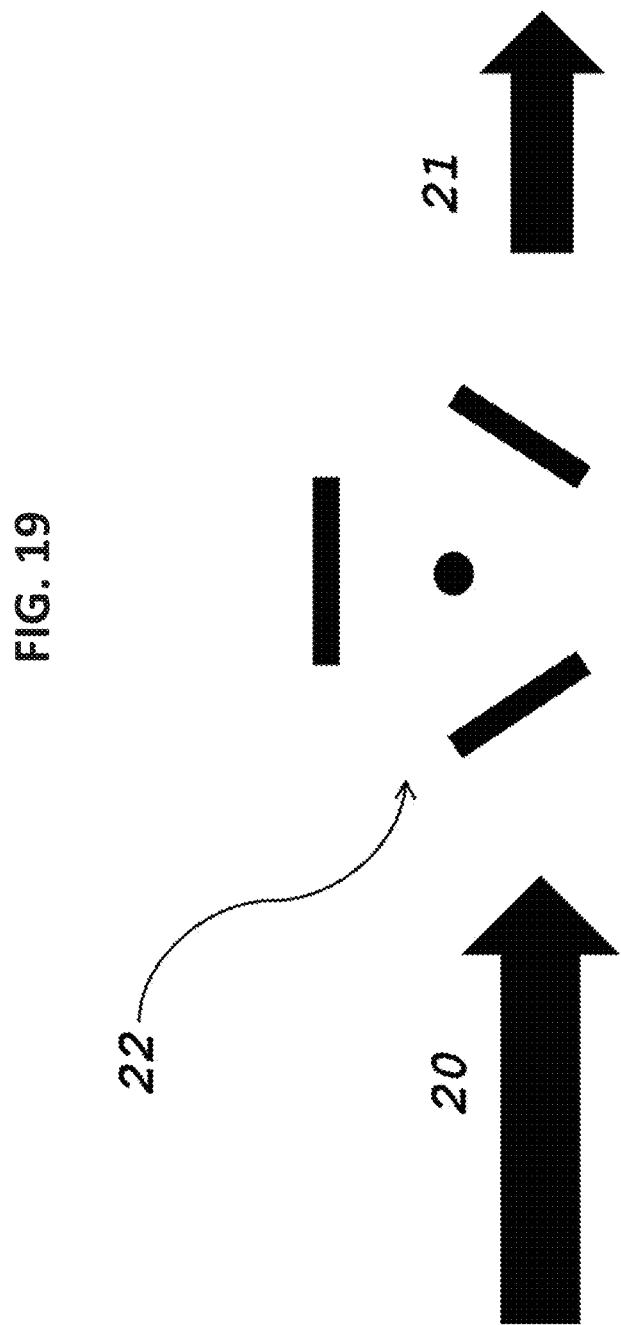

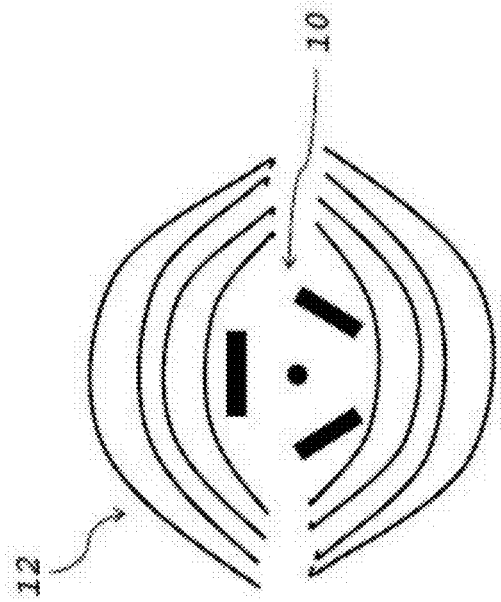
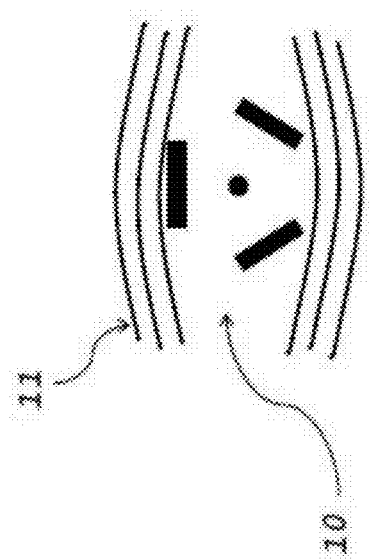
FIG. 20A
FIG. 20B

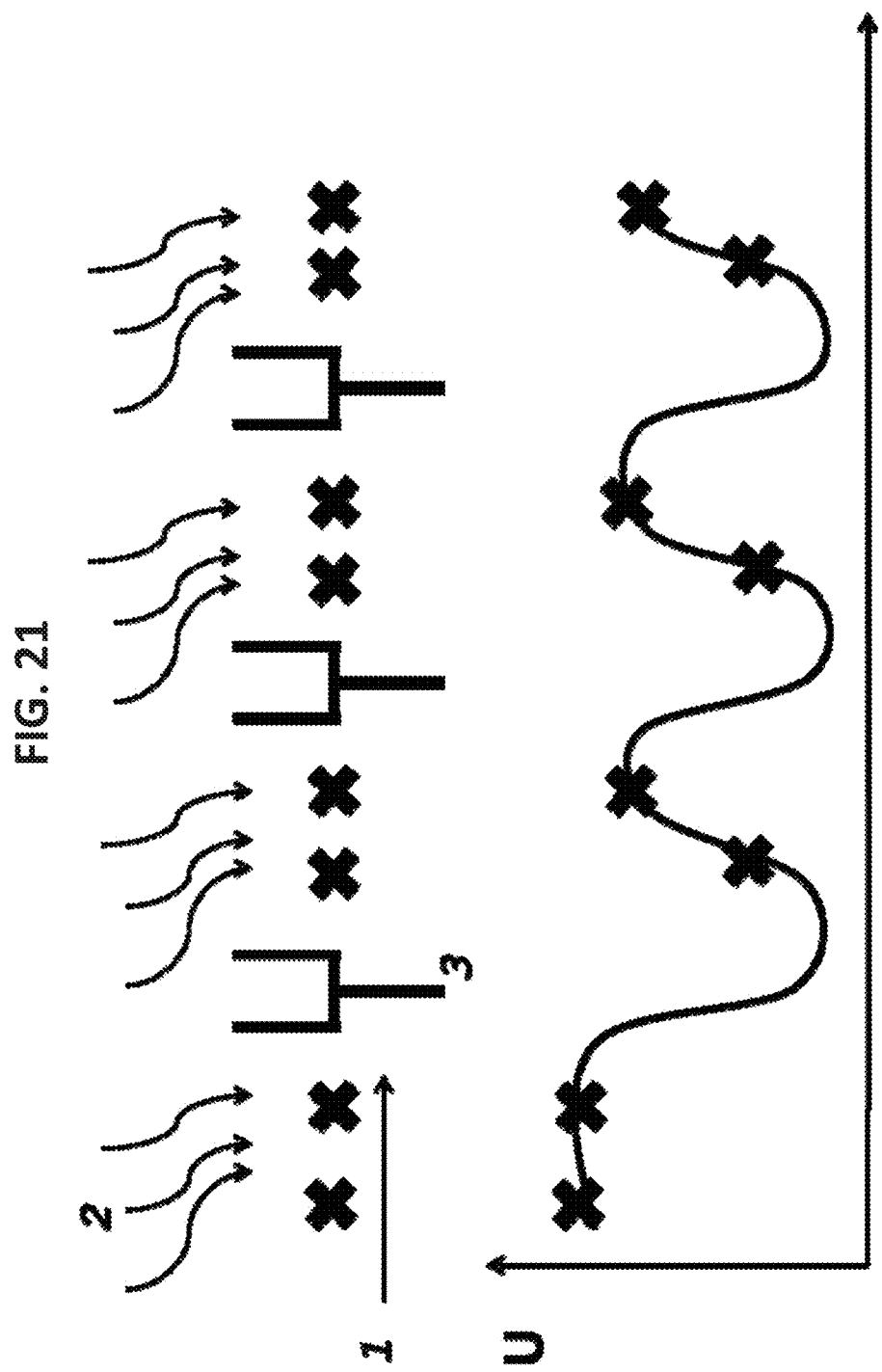

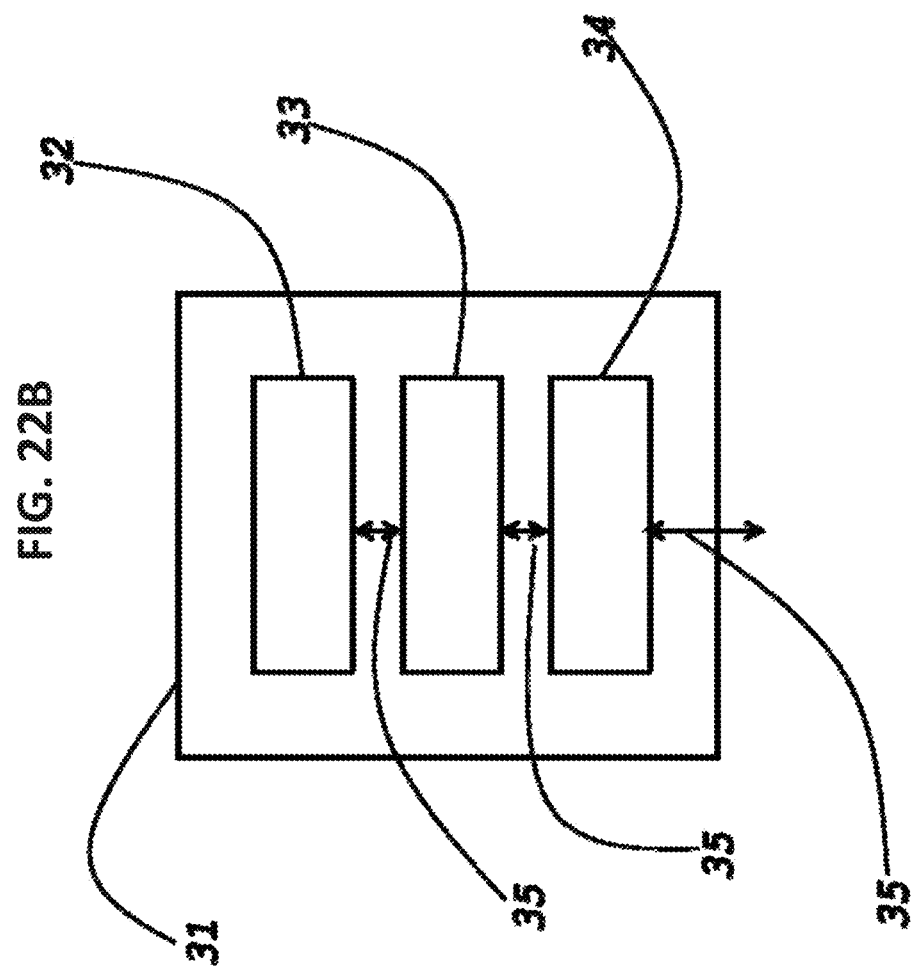
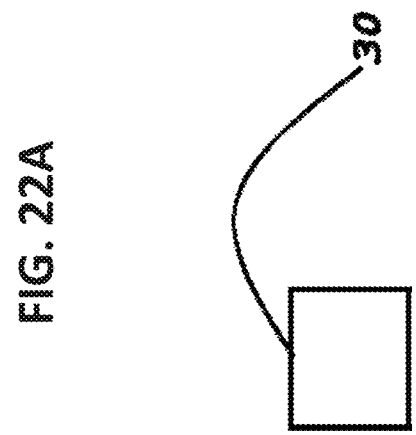

METHODS AND SYSTEMS FOR COMPARING VERTICAL AXIS TURBINE ARRAYS AND PROVIDING CONFIGURATIONS THEREOF

CROSS REFERENCE TO RELATED APPLICATIONS

The present application is a divisional of U.S. patent application Ser. No. 13/572,611 filed on Aug. 10, 2012, which claims priority to U.S. Provisional Application No. 61/523,164 filed on Aug. 12, 2011, both of which are incorporated herein by reference in their entirety.

FIELD

The present disclosure relates to wind turbines. In particular, it relates to a method for siting wind turbines.

SUMMARY

According to a first aspect of the disclosure, a computer-implemented method for providing low-order potential flow elements for a vertical axis turbine is described, the low-order potential flow elements usable for configuring an array of vertical axis turbines. The method comprises executing, using one or more computer systems, executable instructions to perform at least the steps of receiving acquired flow data around a selected vertical axis turbine; assigning one or more variables, each to a set of potential flow elements, the one or more variables representing potential flow around the selected vertical axis turbine; receiving and applying a fitness function configured to evaluate a matching of acquired flow data around the selected vertical axis turbine with potential flow data given by the one or more variables representing potential flow around the selected vertical axis turbine, according to one or more set thresholds, the set thresholds each being associated to a particular region around the vertical axis turbine; and applying an algorithm to the one or more variables, the algorithm configured to output values for each of the one or more variables which match the acquired flow data around the selected vertical axis turbine according to the fitness function, thus providing values for each of the one or more potential flow elements representing potential flow around the selected vertical axis turbine.

According to a second aspect of the disclosure, a computer-implemented method of configuring an array of vertical axis turbines for an array site is described. The method comprises executing, using one or more computer systems, executable instructions to perform at least the steps of receiving input data corresponding to potential flow around one or more of a selected vertical axis turbine; receiving one or more input variables, the one or more input variables representing at least one of a parameter of the array site, a constraint of the array site, and a parameter of the vertical axis turbine; receiving input concerning a number of vertical axis turbines to be configured in the array; receiving input concerning one or more of a desired attribute of a configured array site; receiving input of a fitness function, the fitness function configured to rank configurations of array sites within one or more constraints of the array site, according to one or more set thresholds, the thresholds being set according to a desired attribute of a configured array site; and applying an algorithm to the one or more variables, the algorithm configured to output data corresponding to locations of vertical axis turbines which provide the one or more of a desired attribute of the array of vertical axis turbines.

According to third aspect of the disclosure, a further method for configuring an array of vertical axis turbines for a turbine array site is described. The method comprises selecting a type of vertical axis turbine to be used in the array; providing an array of the selected type of vertical axis turbines; providing one or more potential flow elements representing potential flow around the selected type of vertical axis turbine; selecting one or more input variables, the one or more input variables representing at least one of a parameter of the array site, and a constraint of the turbine array site, a parameter of the vertical axis turbine; selecting a number of vertical axis turbines to be placed in the array; selecting a number of vertical axis turbines to be placed in the array site; designing a fitness function configured to rank configurations of a plurality of vertical axis turbine arrays within one or more constraints of the array site, according to one or more set thresholds, the thresholds being set according to one or more of a desired attribute of a configured array site; inputting into an algorithm values for one or more potential flow elements representing potential flow around the selected type of vertical axis turbine, the one or more input variables, and the number of vertical axis turbines to be placed in the array site, wherein the algorithm is configured to provide geometric data corresponding to locations of vertical axis turbines which provide a desired power output of the array of vertical axis turbines; and configuring the array of the selected type of vertical axis turbines according to the geometric data thus obtained.

According to a fourth aspect of the disclosure, a further method for configuring an array of vertical axis turbines for an array site is described. The method comprises executing, using one or more computer systems, executable instructions to perform at least the steps of: receiving acquired flow data around a selected vertical axis turbine assigning one or more variables, each to a set of potential flow elements, the one or more variables representing potential flow around the selected vertical axis turbine; receiving and applying a fitness function configured to evaluate a matching of acquired flow data around the selected vertical axis turbine with potential flow data given by the one or more variables representing potential flow around the selected vertical axis turbine, according to one or more set thresholds, the set thresholds each being associated to a particular region around the vertical axis turbine; applying a first algorithm to the one or more variables, the first algorithm configured to output values for each of the one or more variables which match the acquired flow data around the selected vertical axis turbine according to the fitness function, thus providing values for each of the one or more potential flow elements representing potential flow around the selected vertical axis turbine; receiving the provided values for each of the one or more potential flow elements representing potential flow around the selected vertical axis turbine; receiving one or more further input variables, the one or more further input variables representing at least one of a parameter of the array site, a constraint of the array site, and a parameter of the vertical axis turbine; receiving input concerning a number of vertical axis turbines to be configured in the array; receiving input concerning one or more of a desired attribute of a configured array site; receiving input of a fitness function, the fitness function configured to rank configurations of array sites within one or more constraints of the array site, according to one or more set thresholds, the thresholds being set according to a desired attribute of a configured array site; and applying an algorithm to the one or more variables, the algorithm configured to output data corresponding to locations of vertical axis turbines which provide the one or more of a desired attribute of the array of vertical axis turbines.

According to a fifth aspect of the disclosure, a V-shaped arrangement of turbines is described. The V-shaped arrangement of turbines comprises at least three pairs of turbines, wherein: the V-shaped arrangement is adapted to be oriented such that a prevalent crosswind enters the opening of the V-shaped arrangement and such that the prevalent crosswind direction is substantially parallel to the axis bisecting the V-shape; each turbine in a pair of turbines is proximate to the other turbine in the pair and non-proximate to other turbines in the array; the vertex of the V-Shaped arrangement comprises a clockwise rotating turbine from which a first arm of the V-shaped arrangement extends in a first direction, and a counterclockwise rotating turbine, proximate to the clockwise rotating turbine, from which a second arm of the V-shaped arrangement extends; turbines comprised in the first arm extending in the first direction are clockwise rotating turbines; and turbines comprised in the second arm extending in the second direction are clockwise rotating turbines.

The present disclosure provides various methods, which in some embodiments can be used in conjunction. A first method according to embodiments herein described can be used to model flow around a vertical axis wind turbine (herein also referred to by the acronym "VAWT") using, for example, potential flow elements including a vortex to capture the rotation of the turbine, a dipole to capture a blockage effect of the turbine, a sink to capture the extracted energy from the wind by the turbine, and a source to capture the recovery of the flow due to inflow from around the turbines. These elements can be combined in different numbers or with different constraints in order to generate a model that is fit to different data sets and that can optimize for computational speed or for accuracy. A second method provides configurations of a VAWT array based on a desired attribute of the array, using a low-order model when the array is subject to physical constraints. The physical constraints on the array can include, but are not limited to discrete locations at which the turbines can be placed, minimal or maximal spacing between turbines, a range and predominance of incoming wind directions, topography of the array site, and number and chirality of turbines.

The details of one or more embodiments of the disclosure are set forth in the accompanying drawings and the description below. Other features, objects, and advantages will be apparent from the description and drawings, and from the claims.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 3A-B shows plots from CFD convergence tests for a WINDSPIRE® turbine geometry. Time, forces, and grid cell size are non-dimensionalized to the parameters of the system. In FIG. 3A, the solid lines indicate the force on a blade in the x-direction as a function of time. The value of h increases in the direction of the black arrow with the values $h=1.27*10^{-2}$, $h=6.35*10^{-3}$, $h=3.18*10^{-3}$, $h=1.58*10^{-3}$, and $h=7.94*10^{-4}$. The dashed lines indicate the time values at which the forces were evaluated for the plot on the right. In FIG. 3B, solid lines indicate force on a blade in the x-direction as a function of h. As indicated in FIG. 3A, (a) indicates values at time t=1, (b) indicates values at t=2, (c) indicates values at t=3, (d) indicates values at time t=4, and (e) indicates values at time t=5.

FIG. 7A shows a plot wherein each point on the plot represents the average of the respective flows over a cross-section of the entire field at the indicated x-position.

FIG. 7B shows a plot wherein each point on the plot represents the average of the respective flows over a cross-section of the band immediately in front of and behind the turbine at the indicated x-position.

FIG. 7C shows a plot wherein each point on the plot represents the value of the respective flow evaluated along the centerline at the indicated x-position.

FIGS. 8A-B show plots wherein velocity is normalized to the value measured experimentally immediately before the first turbine in the array. FIG. 8A shows a plot representing an array centerline velocity profile for a 30×30 array as computed by a potential flow model optimized for computational speed. The solid line is the velocity as computed from the model, the squares are the measurements taken on the 3×3 array. FIG. 8B shows a plot representing an array centerline velocity profile for a 9×9 array as computed by potential flow models optimized for computational speed or for physical accuracy. The solid line is the velocity as computed by the model optimized for computational speed, the dashed line is the velocity computed by the model optimized for physical accuracy. The squares are the experimental measurements from the 3×3 turbine array.

In FIG. 9A, solid lines are centerline flow profiles array sizes (normalized to array diagonal length) increasing in direction of arrow: 3×3, 4×4, 5×5, 7×7, 8×8, and 9×9. Dashed lines mark 1 array length upstream (a), 1 turbine diameter upstream (b), 1 turbine diameter downstream (c), and 1 array length downstream (d). FIG. 9B shows evaluation of the centerline velocities at the points marked by the dashed lines in FIG. 9A for each array size and associated linear fits.

FIG. 10 shows a schematic of a predicted array for a single flow direction using the method for providing a low order potential flow model and the method for providing a configuration of VAWT according the present disclosure. The solid circles represent a counter-clockwise rotating turbine, solid squares represent a clock-wise rotating turbine, the dots represent the possible locations at which the turbines can placed, and the arrow indicates the prevalent wind direction for this example.

FIG. 12A shows a plot of the entirety of the data described above with reference to FIGS. 12A-B. FIG. 12B shows a plot of a close up of the data described above with reference to FIGS. 12A-B to show details of fit.

FIGS. 13A-B show plots representing empirical determination of scaling laws from CFD data. Velocity is normalized to the value incoming to the first turbine in the array. In FIG. 13A, solid lines indicate centerline flow profiles for (in direction of arrow) 3×3, 5×5, 7×7, 9×9 (black), 15×15, 20×20, 30×30, 50×50, 75×75, and 100×100 arrays normalized to array diagonal length. Dashed lines mark 1 array length upstream (a), 1 turbine diameter upstream (b), 1 turbine diameter downstream (c), and 1 array length downstream (d). FIG. 13B shows evaluation of the centerline velocities at the points marked by the dashed lines in FIG. 13A for each array size and associated linear fits.

FIG. 19 shows a schematic illustrating $q_{sink}$. Arrow (20) indicates an incoming cross-wind approaching a wind turbine (22) at a first velocity and exiting at a second velocity (arrow (21)) which is lower than the first velocity as a result of energy taken out by the turbine (22).

FIGS. 20A-B shows schematic illustrations of a "blockage effect" or "dipole" (represented by μ) on two turbines (10). The schematic illustrations of FIGS. 20A-B show a view from above (aerial view) the turbines (10) looking down. FIG. 20A shows an example of a lower value of μ wherein less blockage is observed as indicated by (11), compared to FIG. 20B which shows a higher value of μ and has a larger meandering of flow indicated by (12).

FIG. 21 shows a schematic illustrating recovery (q or $q_{source}$) of wind flow as it passes through wind turbines (3). The arrows coming from above array (2) represent wind that comes from above the array rather than cross-winds (1). This can be referred to as turbulence and serves a source of energy separate from the main cross-winds and can allow for a recovery of wind speed between turbines (3). In FIG. 21, the X's indicate geometric positions between wind turbines (3) and the plot below the turbines (3) indicates a variation in U (free-stream velocity) as a function of geometric position due to recovery ($q_{source}$). FIG. 21 shows a general and approximate trend for change in U as a function of geometric position in an array due to recovery; however, it is not a quantitative or exact representation.

FIGS. 22A-B show schematics of exemplary computer systems that can be used to carry out computer-implemented methods according to the disclosure. FIG. 22A shows a computer system (30) which can be used to carry out computer-implemented methods in some embodiments. FIG. 22B shows a computer system (31) comprising a memory (32), a processor (33), a communications interface (34) and an interconnection arrangement (35) coupling the memory, processor and the communications interface. In FIG. 22B, the memory can be encoded with instructions for executing one or more steps of the methods of the disclosure.

FIG. 23A shows a single computer which can be used to carry out computer-implemented methods described herein. FIG. 23B shows a schematic of a computer system wherein the computer-implemented method herein described is carried out on multiple computers in parallel.

DETAILED DESCRIPTION

Figure 1:
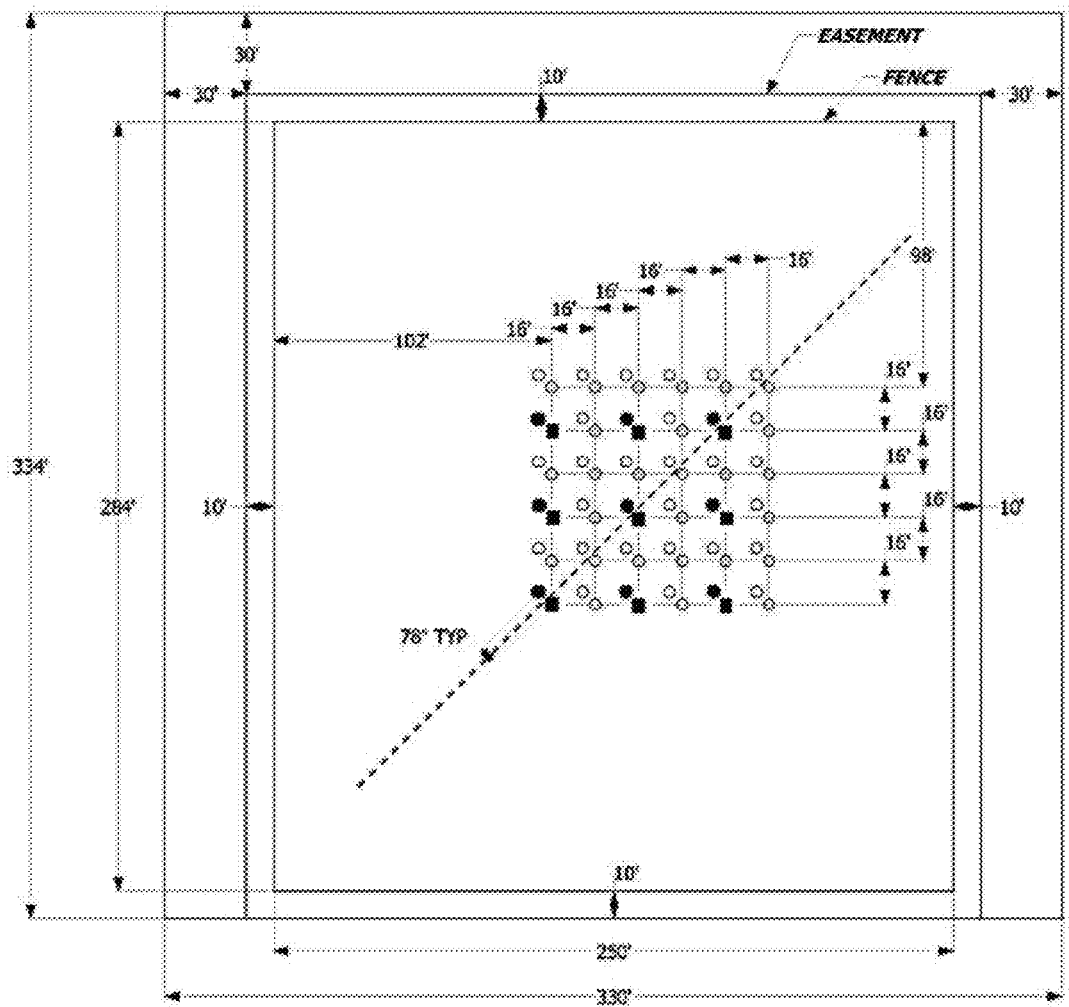
FIG. 1 shows a schematic of field array according to some embodiments. Open circles represent possible positions for turbines. Solid circles represent counter-clockwise rotating turbine locations for experimental data acquisition; solid squares represent clockwise rotating turbine locations for experimental data acquisition. Dashed lines indicate a centerline of the array. All dimensions are in English units. North is towards the top of the FIG. 1.

Numerical modeling of vertical axis wind turbines (VAWTs) has typically focused on a detailed modeling of individual wind turbines for use in optimization of turbine design. Models that fall into this category include the actuator-disk model [8], the momentum model [10], the cascade model, and the vortex model [7]. Some more recently developed models are hybrids of these methods, for example, the momentum-vortex model [2]. One model has been developed which attempts to capture an overall behavior of turbines using a minimal number of variables, the potential flow model developed by Whittlesey et al. [15].

The potential flow model of Whittlesey et al. [15] consisted of a uniform flow with a dipole and a point vortex superimposed to represent one VAWT. The point vortex was used in order to account for the rotation caused by the turbine and the dipole (aligned along the x-axis) was used to account for the blockage due to the presence of the turbine in the flow.

Transcribed to the notation used in the present disclosure, the equations describing the flow elements in Whittlesey et al. [15] were given by:

$$F = U_\infty - i\frac{\Gamma}{2\pi}\log(z) + \frac{\mu}{2\pi z} \quad (1)$$

$$W = \frac{dF}{dz} \quad (2)$$

$$u = \Re(W)\hat{i} - i\Im(W)\hat{j} \quad (3)$$

where $U_\infty$ refers to the free-stream flow speed, $\Gamma$ is the strength of the point vortex, $\mu$ is the strength of the dipole, $\hat{i}$, $\hat{j}$ are the unit vectors in the x,y directions, respectively, and z=x+iy (x and y are real numbers.) In order to model an array of K turbines, the potential flow elements were simply summed:

$$F = U_\infty z + \sum_{k=0}^{K}\left[1\frac{\Gamma}{2\pi}\log(z-z_k) + \mu(z-z_k)^{-1}\right] \quad (4)$$

where $z_k$ corresponds to the location of the kth turbine. As for a single turbine, equation 3 can be used to compute the velocity field. To account for the velocity deficit in the wakes of the turbines, velocity-deficit curves [6] were applied:

$$u^*(z)=(1-\xi_w(z))u(z) \quad (5)$$

where u* is the resulting velocity vector after accounting for wake effects and $\xi_w(z)$ is a spatial function representing the deficit: a normal probability density function (PDF) in the lateral direction and a beta PDF in the downstream direction. Accounting for the wake in this manner implies that u* is no longer a solution to the potential flow equations.

This model was least-squares matched to a small set of velocity vectors taken in the vicinity of a functioning VAWT. Thus, for a given $U_\infty$, $\Gamma$ and $\mu$ can be found. The completed model was used to numerically evaluate an arrangement of turbines designed to mimic the swimming patterns of fish schools that is closely spaced counter rotating pairs of VAWTs. Arrangements of turbines were compared by considering an array performance coefficient and a power density parameter. The array performance coefficient was defined to be:

$$C_{AP} = \frac{\overline{P_{array}}}{P_{iso}} \quad (6)$$

where $P_{iso}$ is the power output from a single isolated turbine and $P_{array}$ is the average single turbine power output when the turbine is in an array (assuming that all turbines in the array are homogeneous). The power density parameter was defined as:

$$C_{PD} = \left(\frac{P_{array}}{A_{array}}\right) \bigg/ \left(\frac{P_{iso}}{A_{iso}}\right) \quad (7)$$

$$= K \cdot C_{AP} \frac{A_{iso}}{A_{array}}$$

where $P_{array}$, $A_{array}$ are the total power and land area of the array, respectively, $A_{iso}$ is the land area of an isolated turbine, and K is the number of turbines.

It was found that for some spacings between turbines, the $C_{AP}$ of the arrays comprising closely spaced counter-rotating pairs of turbines was greater than unity (i.e. the output from the array of K turbines was more than would be expected from K isolated turbines). A streamline analysis indicated that stream-tube contraction between pairs of counter-rotating turbines and the concomitant flow acceleration are primarily responsible for the improvements in the expected power output. Further, a comparison of the power density of operative horizontal axis wind turbines (herein also referred to as the acronym "HAWT") arrays to VAWT arrays indicate an order of magnitude better power output per unit land area. Dabiri [5] experimentally demonstrated the improved performance of pairs of VAWTs over isolated VAWTs and confirmed using a small array of 6 turbines, that the power density performance of the array was 6-9 times better than that of modern HAWT farms.

According to embodiments of the present disclosure, a method for modeling low-order potential flow of a vertical axis turbine is described. In particular in some embodiments the vertical axis turbine is a vertical axis wind turbine (herein referred to as a "VAWT"). In other embodiments, the vertical axis turbine is an underwater turbine. While various embodiments are described herein with reference to VAWTs, a skilled person will understand how to adapt embodiments described with reference to VAWTs to embodiments using vertical axis underwater turbines, which are also within the scope of the present disclosure. For example, descriptions and examples herein with reference to a wind direction and/or source can be considered as being analogous, in some embodiments, to a direction and/or source of water current.

A low-order potential flow model of a VAWT according to some embodiments can allow for potential flow around a VAWT to be represented by a small set of numerical values, for example 3 to 4 numerical values.

In particular, embodiments of the present disclosure, allow for the potential flow around a VAWT to be represented by a "blockage" effect (herein also referred to as a "dipole" and represented by $\mu$), rotational motion (herein also referred to as a "vortex" and represented by $\Gamma$), an energy sink (herein represented as "q" or "$q_{sink}$") and an energy source (herein also referred to as "turbulence" and represented as "q" or "$q_{source}$").

The "blockage" or (µ) effect can be described as being analogous to water flowing around a rock in a stream and is shown schematically in FIGS. 20A-B. For example, with a low value of µ, a small amount of blockage is observed (11) in proximity to the turbine (10), while with a high value of µ, a big meandering of flow would be observed (12) in proximity to the turbine (10).

The rotational motion (Γ) can be described in line with the rotation of the VAWT. For example, if Γ is very small, there would be very little rotational motion.

As shown schematically in FIG. 19, q, and in particular $q_{sink}$ can be described by considering that the velocity of wind flow into a wind farm is greater than the velocity that goes out based on the energy being taken out of the flow by the turbine. Therefore, an incoming wind velocity (20) can be greater than the velocity (21) of the wind after passing through one or more turbines (22). This loss in velocity of the wind can be represented by $q_{sink}$.

In a wind farm, wind can be coming across a wind farm but can also be coming from above (herein also referred to as "turbulence"), and this can be described by $q_{source}$. Therefore, $q_{source}$ can provide additional energy into a flow from turbulence and can lead to a recovery of wind velocity through the wind farm. A contribution of energy to an array of turbines by way of turbulence is shown schematically in FIG. 21. In FIG. 21, U represents the velocity of a crosswind as it travels through various positions (X) with respect to an array of turbines (3) and wind from above the array (turbulence) is indicated with curvy arrows (2). FIG. 21 schematically shows a crosswind (1) velocity decreasing after passing through a first turbine and then increasing before reaching the next turbine, which is referred to as "recovery" and can be attributed to the turbulence.

According to embodiments herein described, $q_{source}$ is a parameter, which can become more relevant in embodiments in which an arrangement of turbines rather than a single turbine is being considered.

According to some embodiments herein described, a potential flow model around a selected VAWT can be provided by first determining which numbers corresponding to µ, Γ, $q_{sink}$, and $q_{source}$, can be attached to a given flow and then using an optimization, for example a local optimization (e.g. a genetic algorithm) to find which values for these parameters will give the best match either simulated or experimental data representing wind flow around the selected VAWT.

According to further embodiments of the disclosure, the potential flow model for a given VAWT can be used to provide arrays based on a desired attribute of the array, for example, maximizing power output per unit land area of the array, minimizing environmental impact, or minimizing acoustic, radar, or visual impacts. In these embodiments, a local optimization can be used (e.g. a genetic algorithm) to predict a geometrical arrangement of turbines, which optimize (at least locally) the power output of the array.

The term "potential flow" as used herein refers to a possibly nonsteady, multidimensional flow of a fluid having a substantially irrotational velocity field and being substantially frictionless. Potential flow can be used to describe a velocity field as a gradient of a scalar function (e.g. velocity potential). For example, potential flow can be used to describe an outer flow field for airfoils such as a wing or a blade (e.g. of a turbine), water waves, electroosmotic flow, and ground water flow. One feature of potential flow is that the combined effect of a plurality of flows due to a corresponding plurality of objects in the flow (e.g. VAWTs) can be calculated by a mathematical addition of the independent flows created by each individual object. Therefore, in embodiments, where flow is simulated, simulating potential flow can reduce a computational cost of simulating the flow around multiple objects (e.g. VAWTs).

The term "potential flow element" as used herein refers to a parameter used to represent potential flow around an object. For example, a dipole µ, can be added to a potential flow expression in order to describe a velocity field moving around an object and the dipole term can be referred to as a "potential flow element". Potential flow elements can be used, for example, in a generation of a flow field and can include one or more a vortex Γ, a dipole µ, a source $q_{source}$, and a sink $q_{sink}$.

The term "fitness function" as used herein is refers to a mathematical expression, which selects a best element or best set of elements with respect to some criteria from some set of available alternative elements. For example, a fitness function can be used to determine how close one or more solutions are to achieving a set goal, for example, by assigning a score to each of the one or more solutions, the score being indicative of how close the one or more solutions are to achieving a set goal. The set goal can be, for example, a matching with a set value (e.g. a numerical value). For example, the solutions can be ranked from best to worst based on their fitness values as calculated by the fitness function.

The term "genetic algorithm" as used herein refers to a search heuristic which is designed to mimic the process of evolution and typically comprises use of a genetic representation of a solution domain and a fitness function to evaluate the solution domain. For example, a fitness function can be defined over a genetic representation and can be set to measure the quality of a represented solution. In initial steps of a genetic algorithm, a number of individual solutions are can be randomly generated to form an initial population or can be "seeded" in areas where optimal solutions are likely to be found or have been previously found through results of genetic algorithm, experimental results, simulated results, a physical limitation, a calculation, or an educated guess.

The term "free stream velocity" as used herein refers to the velocity of undisturbed fluid flow (either real or modeled). For example, if a gust of wind moves towards a turbine array, before it reaches the array, it can be considered to be moving at "free stream velocity". As another example, wind movement to either side of a turbine array that is unaffected by the array can also be considered to be moving at "free stream velocity".

The term "low-order" as used herein can be used to describe a computational model, which represents a physical system using a minimal or relatively low number of variables, for example compared to a simulated model. For example, a low-order computational model can allow computations involving the model to be more rapidly evaluated compared to a higher order model such as a simulated model. A low-order model generally describes the physical system in less detail than a higher order model, focusing instead on generating a more global, bird's-eye, view of the physical system.

The term "optimization" as used herein refers an optimization which is directed to a desired effect, for example, power output of a turbine array or power output within one or more constraints of a system for which the optimization is being performed (e.g. configurations of turbines). Such constraints can vary and can be defined by a user and therefore, any given optimization can be considered as an optimization according to user input. Therefore an "optimization" as herein described is a relative term, which can vary depending on, for example, constraints of the system. Further, the optimizations herein described refer to local optimizations.

The term "local optimization" as used herein refers to an optimal solution to a problem or equation with respect to a neighboring set of solutions to the same problem or equation.

According to the present disclosure, a method is provided for modeling potential flow of turbines, which can in some embodiments be computationally simple. In some embodiments, the method can be used in a further method for providing arrangements of a large number of turbines which can be computed relatively quickly and allow for examination of multiple configurations of turbines as well as different flow directions into the array in order to find a desired arrangement of the turbines based on a desired attribute of the turbine array.

The method for providing a low-order potential flow model of a vertical axis wind turbine comprises adopting one or more of a selected VAWT unit to serve as a model. In some embodiments, a single VAWT can serve as the model. In other embodiments, a pair of VAWTs can serve as the model. In these embodiments, the pair of VAWTs can be co-rotating VAWTs or counter-rotating VAWTs. According to further embodiments, various combinations of a single turbine, a pair of co-rotating turbines, and a pair of counter-rotating turbines can be used together.

The method further comprises assigning a variable to one or more potential flow elements to represent potential flow around the selected VAWT. Potential flow elements can include, for example, rotational ($\Gamma$), a blockage effect ($\mu$), energy taken in by the VAWT (q or $q_{sink}$), and turbulence (q or $q_{source}$). The number of potential flow elements to be used in representing potential flow around a selected VAWT can depend on whether it is desired to obtain values for the potential flow elements with a higher computational speed or whether it is desired to obtain set of values which can more accurately represent the turbine. Further, in connection with using these values to obtain a configuration of turbines in an array according to embodiments herein described. Eliminating a potential flow element can decrease the accuracy of the algorithm and increase computational speed. Adding potential flow elements can increase the accuracy of the algorithm and decrease computational speed. Therefore, the number and type of potential flow elements can depend on a desired balance between speed and accuracy of the computation.

In some embodiments, a potential flow element can be included or excluded based on an expected contribution of the potential flow element. For example, if potential flow elements which are expected to have a value close to zero can be excluded to decrease computation time with substantially a same accuracy as can be obtained by including the potential flow element. For example, if an array site is expected to have little or no turbulence, then $q_{source}$ can be excluded to decrease computational time. As a further example, if an array site is expected to a high level of turbulence, $q_{source}$ can be included to obtain higher accuracy, and in some embodiments, more than one $q_{source}$ can be included.

In potential flow models according to some embodiments herein described, the complex potentials (F) and complex velocities (W=dF/dz) of each element can be estimated with the following equations.

Uniform Flow:

$$F = U_\infty z$$

$$W = U_\infty \quad (8)$$

Vortex:

$$F = -i\frac{\Gamma}{2\pi}\ln(z - z_0) \quad (9)$$

$$W = -i\frac{\Gamma}{2\pi(z - z_0)}$$

Dipole:

$$F = i\frac{\mu}{2\pi(z - z_0)} \quad (10)$$

$$W = -i\frac{\mu}{2\pi(z - z_0)^2}$$

Source/Sink:

$$F = \frac{q}{2\pi}\ln(z - z_0) \quad (11)$$

$$W = \frac{q}{2\pi(z - z_0)}$$

In this notation, $\Gamma$ represents the strength of a vortex, $\mu$ represents the strength of a dipole, q represents the strength of a source if positive and the strength of a sink if negative, z is the point in the complex plane at which the flow is being evaluated (z=x+iy, where x,y$\in \mathbb{R}$ ), and $z_0$ is the location in the complex plane of the element being evaluated. In embodiments where multiple elements are present, the corresponding F and W can be summed. Once W has been computed, the velocity flow field u can be represented by:

$$u = \Re(W)\hat{i} - i\Im(W)\hat{j} \quad (12)$$

Here $\hat{i}$ and $\hat{j}$ represent the unit vectors in the x and y directions, respectively, and $\Re$, $\Im$ are the real and imaginary component operators, respectively.

The method herein described further comprises designing a fitness function adapted to allow a matching of acquired flow data around the selected VAWT unit with potential flow data given by the one or more variables representing potential flow around the selected VAWT, within one or more set thresholds, the set thresholds being associated to a particular region around the VAWT.

The method herein described further comprises applying an algorithm to the one or more variables, the algorithm configured to output numerical values for each of the one or more variables which match the acquired flow data around the selected VAWT unit according to the designed fitness function, thus providing numerical values for each of the one or more potential flow elements representing potential flow around the selected VAWT.

By way of example and not of limitation, a method for modeling potential flow of a VAWT cross-section according to some embodiments is now described.

In order to generate a model, a number of each type of element, a position of each element, and a strength of each element in a potential flow can be optimized such that a resulting flow field designated herein as "$u_{model}$", matches as closely as possible to original or "acquired" data.

In some embodiments, the acquired data is experimental data, herein designated "$u_{exp}$". In other embodiments the acquired data is simulated data, herein designated "$u_{sim}$".

For example, in order to acquire experimental data, a particular type of VAWT and number of VAWTs in array can be arranged on a desired array site to form a turbine array. The particular type of turbine selected can vary in height, diameter, chirality, and cut in wind speeds, for example. The turbines can be arranged, for example, according to constraints of the array site, such as size of the array site, topology of the array site, and available positions in which the turbines can mounted and/or based on constraints of the VAWT, such as diameter of the turbine, and number of turbines.

In particular, constraints on a system can be input into a computation as bounds on a variable space over which the optimization algorithm is performed. For example, if it was desired to contain the array within a plot of land of known dimension, but the turbines can be anywhere within that plot of land, the algorithm can take the positions of the turbines as variables and the possible range of positions (e.g. based on the size of the available plot of land) can be set as limits on which values the variable can attain.

Similarly, constraints such as size of the array site, available positions in which the turbines can be mounted, number of turbines, chirality of turbines, and diameter of turbines, which can be considered as limits in the physical system (e.g. having little or no flexibility) can be input into the optimization algorithm as bounds on respective variables.

Constraints on a physical system, which are considered to be flexible, can be put into the optimization as modifiers of the fitness function. For example, if there is a hill near the center of the land plot available, and turbines can be placed behind the hill with respect to a certain wind direction, a fitness function can be designed such that if a turbine position was behind the hill, the evaluated incoming wind velocity would be modified by some set amount to account for the wind blockage from the hill.

In some embodiments, a three-dimensional nature of the flow (e.g. due to topography) can be accounted for, for example, by stacking a plurality of two dimensional models, one on top of another and passing information from one layer to another.

According to embodiments herein described, turbines can arranged as a series of single turbines, as pairs of turbines (either co-rotating or counter-rotating), or in another group of turbines that are spaced closely enough that non-linear fluid flow interactions can be substantial. Non-linear fluid flow interactions can be considered to be substantial if the flow around each turbine in a group of turbines, when added together, does not provide a desired level of accuracy (e.g. a "non-linear interaction") in physically representing the flow around the group of turbines. This can be due to influences between proximate turbines.

For example, by analogy, a first rock in a stream can provide a first flow pattern and second rock far downstream from the first rock can provide a second flow pattern which can be similar to the first pattern and thus both flow patterns can be represented by a same model. If the first rock and the second rock are closer together (e.g. one rock immediately behind or in front of another), the flow around each rock can be altered. For example, at least part of the flow directly behind the first rock will not be seen by the second rock; therefore, in this example, adding the models for each individual rock can considered as not accurately representing the two rocks. Therefore, the farther apart the two rocks, the more accurately the two rocks can be represented by a model which adds two individual models.

In some embodiments, potential flow elements can be provided for a single turbine or a group of proximate turbines (e.g. to account for non-linear interactions between proximate turbines). In some embodiments the groups of proximate turbines are a pair of co-rotating turbines, a pair of counter-rotating turbines, and/or another group of turbines rotating in various respective directions. According to some embodiment, an increase in the number of turbines can lead to an increase in computational time. Therefore, in embodiments where shorter computational times are desired, a lesser number of turbines in the group can be used.

FIG. 1 shows a schematic of an exemplary turbine array, which can be used for obtaining experimental data. In particular, FIG. 1 shows an array with eighteen turbines, nine counter-clockwise rotating and nine clockwise rotating. As would be understood by a skilled person, various other arrangements can be used.

In order to obtain experimental data from a turbine array, measurements can be obtained for parameters of a turbine including but not limited to electrical power generated by each turbine, turbine rotational speed, turbine aerodynamic torque, turbine acoustic signature, and turbine radar cross-section. Each of these parameters, either alone or in combination, can be used to match acquired experimental data with potential flow data given by one or more variables representing potential flow around the turbine.

According to some embodiments herein described, a selection of one or more parameters of a turbine for which to obtain measurements can be based on which attributes of a configuration of turbines is desired to be optimized and/or compared with other configurations of turbines. For example, power output measurements can be used to provide a power-output optimized configuration of turbines and/or to compare configurations of turbines based on the power output of each configuration, and an acoustic output measurement can be used, for example, to optimize for a quieter configuration of turbines and/or to compare configurations of turbines based on acoustic output of each configuration.

According to a further embodiment, the measurements of parameters of the turbine can be used to design a more realistic fitness function.

In a further embodiment, the measurements can be used to provide a database of potential flow elements in connection with various physical aspects of a turbine (e.g. rotational speed, cross section, blade number, blade diameter, and/or height). For example, the potential flow elements in connection with various physical aspects of a turbine can be provided according to methods herein described. In these embodiments, physical aspects of a selected turbine to be placed in an array can be compared to the database and potential flow elements which can be used to represent flow around the selected turbine can be directly matched to turbine based on its physical aspects.

In some embodiments, the electrical power generated by each turbine can be monitored in real-time and recorded, for example using power meters. In these embodiments, power meters can be connected to a central data logger. Various other methods for obtaining experimental data from a turbine array are identifiable by a skilled person.

In some embodiments a meteorological tower can be used to collect experimental data from a turbine array. The data obtained in this way can be used to estimate the wind speeds within the array, for example, along the centerline of the array.

In these embodiments, a single meteorological tower can be used or a plurality of meteorological towers can be used. For example a plurality of meteorological towers can be placed at a plurality of positions throughout the array to obtain measurements. As another example, a single meteorological tower can be moved from a first position to a series of subsequent positions after obtaining measurements at the first position and each subsequent position and can continue to be moved in this way until measurements at any desired locations is obtained. Data from one or more meteorological towers can also be recorded using a datalogger.

Experimental data can be obtained over a period of time ranging from minutes to years, depending on the inherent variability of the wind at a particular site as would be understood by a skilled person. For example, the more variable the wind is at a particular site, the longer it can take to obtain which can be used to represent the potential flow elements with a desired level of accuracy. An exemplary method for obtaining experimental data is shown in Example 1.

According to some embodiments, in relating the power output of a turbine (P) obtained experimentally to flow conditions, it can be estimated that $P \propto u_{\parallel}^3$ where $u_{\parallel}$ is the flow directed into the turbine (i.e. parallel to the free-stream direction).

As previously mentioned, in some embodiments the acquired data is simulated data. In these embodiments, simulated data can be obtained through various simulations, including but not limited to CFD simulations, Monte-Carlo simulations, molecular dynamics simulations, and equation-free simulations. These simulations, and other simulations identifiable by a skilled person, can have varying degrees of speed and accuracy. Therefore, a selection of one of these simulations to be used according to embodiments of the present disclosure, can be based on whether it is desired to have a higher speed simulation or whether it is desired to have a simulation which can provide a higher accuracy.

In these embodiments, a flow field around the VAWTs can be obtained by two-dimensional simulations of at least one of a single VAWT cross-section, a pair of co-rotating turbines, and a pair of counter-rotating turbines. For a more complete flow field around the VAWT, simulations of the single VAWT cross-section, the pair of co-rotating turbines, and the pair of counter-rotating turbines can all three be obtained. For example, in embodiments where accuracy is more important, all three simulations can be obtained. In embodiments where a short time is important, simulation of a single VAWT cross-section can be used.

In some embodiments, for simulation of one or more VAWT cross-sections, an arbitrary geometry and convergence conditions can be defined.

For example, in embodiments where CFD simulations are used an immersed-boundary Navier-Stokes solver can be used to compute a two-dimensional flow around arbitrarily defined geometries. In some embodiments, the geometry can be made to resemble cross-sections of the turbines used for experimental data such that two related sets of acquired data are obtained.

A grid size and time step can be selected to allow convergence of the flow. A grid size and time step can be selected, for example, such that given basic physical properties of a simulated fluid and simulated flow conditions, a same flow solution is found for smaller values of the grid size and time step. This example can be considered to be a converged solution and can indicate that the simulated flow is being adequately tracked from one grid cell and time step to the next grid cell and time step.

In some embodiments, the Courant-Friedrichs-Lewy (CFL) condition can be used to determine the numeric stability of the simulation and is defined to be $$CFL = \frac{U * \Delta t}{h} \quad (13)$$

where U is represents a non-dimensional velocity (maximum velocity of the turbine/incoming free stream velocity), $\Delta t$ represents a non-dimensional time step (dimensional time×incoming free stream velocity/diameter of the turbines), and h represents a non-dimensional grid cell size (dimensional size/turbine diameter). For the simulation to be numerically stable, for example such that errors in the simulated system do not grow exponentially, it is can be set that $CFL \leq 0.7$. In some embodiments, absolute values of $\Delta t$ and h can be varied so that the $CFL \leq 0.7$ ratio will hold.

In an exemplary embodiment, the simulations are run at $CFL = 0.25$ varying absolute values of $\Delta t$ and h (See e.g. Example 2).

In some embodiments, maximum dimensional velocity of a system can be conservatively taken to be the free-stream velocity plus the tip velocity of the rotating turbines plus a margin of error of around 0.5 m/s. In order to analyze convergence, the forces on one of the blades of the turbine can be examined over time.

In order to limit computational time, simulations can be run with more than one grid level. For example two or more grid levels can be used wherein a fine grid is used close to the turbine and a coarse grid is used over an entire simulated domain.

Figure 6:
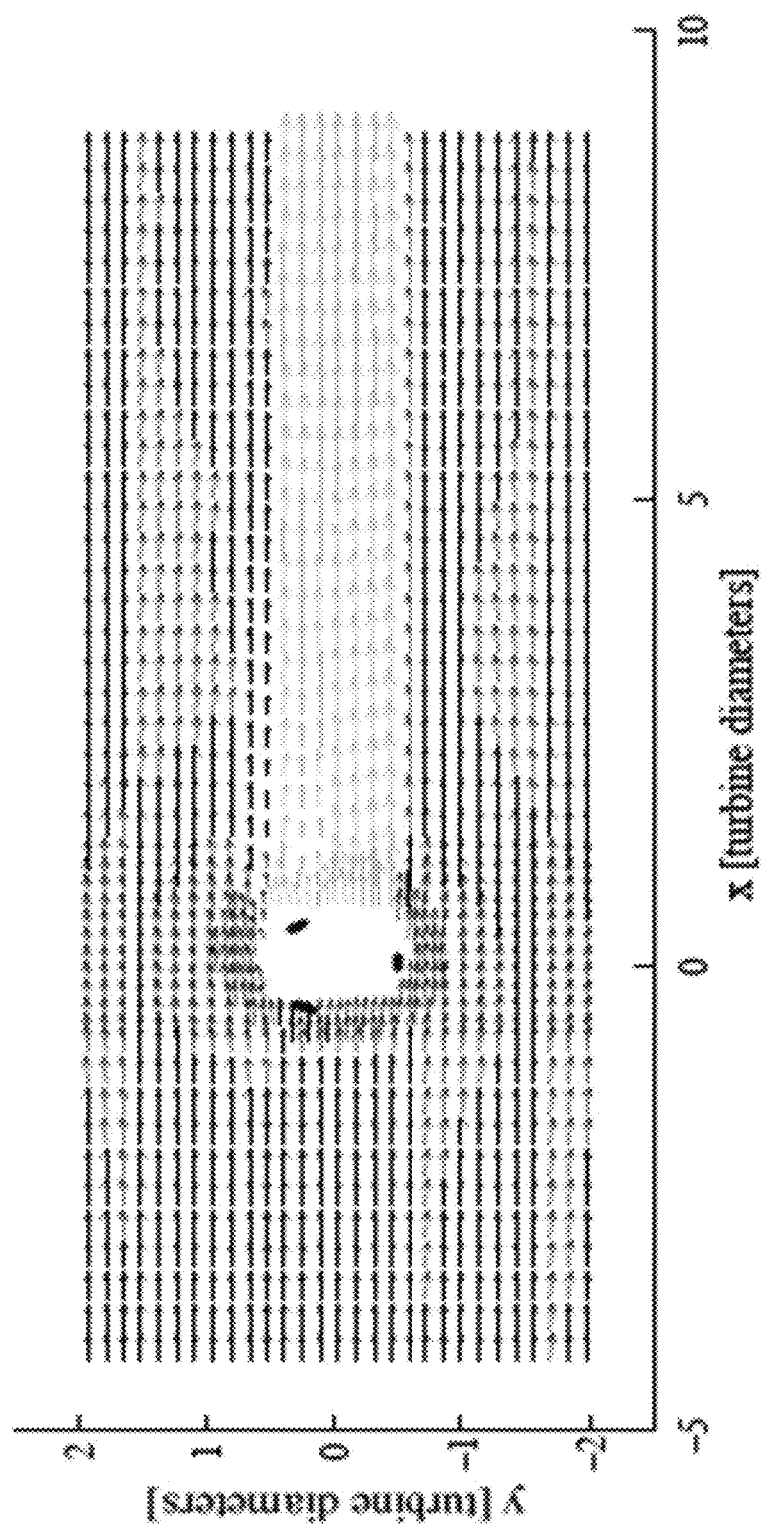
FIG. 6 shows a plot representing averaged, thinned CFD velocity vector field for a single WINDSPIRE® turbine. The solid lines indicate the blades of the turbine, the light gray, boxed vector field indicates the region of the flow designated as the wake region and the black vector field indicates the region of the flow designated as the surrounding region.

A fine grid can be used over relatively short distances, for example, in front of and to either side of the turbine and relatively long distances downstream of the turbine as these areas can be most affected by the turbine (See e.g. FIG. 6). For example, in some embodiments a fine grid can be used over approximately 0.5 D, D representing a turbine diameter, in front of and to either side of the turbine and approximately 5 D downstream from the turbine.

A coarse grid can be substantially larger, covering areas outside those described above with respect to the fine grid. For example, the coarse grid can be just over approximately 3.5 D upstream, approximately 1.5 D to either side of the turbine and approximately 8 D downstream. Other variations are identifiable by a skilled person and can depend on factors such velocity of cross winds and/or computational factors such as time and/or accuracy of the simulations. For example, if the flow is simulated for higher velocity cross winds, the fine grid can be extended further downstream than for a flow which is simulated for a lower velocity cross wind.

A matching of experimental data to provide a model of potential flow is now described by way of example.

In some embodiments a model can be evaluated and compared to other models by a root-mean-square difference between the experimental data points and corresponding model data points. In these embodiments, the fitness function of the genetic algorithm can be set to minimize this RMS difference.

In some embodiments, centerline data velocities are matched. The centerline velocity can be used can be used to describe the velocity profile of a VAWT array. In particular, the velocity profile can indicate how velocity of a cross wind changes as a function of position throughout the VAWT array. For example, the velocity profile can show how the velocities drop as the array progresses (which can be considered a significant characteristic of the array. Therefore, the centerline velocity can be used as a method to evaluate and compare a plurality of VAWT arrays having different configurations. Experimentally acquired centerline velocities can be obtained, for example, from meteorological tower measurements as herein described.

In some embodiments, in matching experimental turbine velocity data, which can be taken to be the cube root of the measured power data, a line of data points can be taken perpendicular to the free-stream flow direction and spanning from one edge of a turbine to another. The component of potential flow perpendicular to this line (parallel to the free-stream direction) can then be determined at each of the test points and averaged in order to determine the flow velocity into each turbine as a single number, $u_{\|}$, see for example, FIG. 5.

Several embodiments of the disclosure allow a reduction of a number of variables for modeling a turbine. For example, in some embodiments, models estimate that there is a vortex and a dipole at the center of each turbine and thus a total number of vortices and dipoles is equivalent to the number of turbines included in the array.

The sinks can either be "free-floating", for example, a position optimized within a small box centered on a turbine or "fixed", for example, a position either predetermined or determined by modeled flow. A selection of the sinks to be either free-floating or fixed can be based on whether it is desired to have a model with greater physical accuracy, in which case free-floating sinks can be used, or a model which can be calculated with higher computational speed and can thus be provided in less time, in which case the sink can be fixed.

The sources can either be modeled as fixed, free-floating (e.g. within a same range as a sink) or as a source field over an entire array comprising sources of equal strength placed in a regular grid. Here again, a selection of the sources to be free-floating, fixed, or as a source field over an entire array can be based on whether it is desired to have a model with greater physical accuracy or a model, which can be provided in less time. Once again, the free-floating sources can provide a model with higher accuracy while using either a fixed source or a source filed over an entire array, can provide a model in less time. Between a fixed source and source over an entire array, the fixed source can provide a model with higher accuracy while the source over an entire array can provide a model in less time.

As already described herein, a vortex element can be used to model, physically, a rotational component introduced to the flow by a rotating turbine, a dipole element can be used to account for "blockage" effects of the turbine, a sink can be used to account for an extraction of energy from the wind by the turbine, and a source can be used to simulate flow recovery due to entrainment of free stream flow in wake.

In some embodiments, a source field can be used to simulate inflow of air from above the turbine array [4] rather than a single source. In these embodiments, a uniform field can be estimated.

In some embodiments, a selected location of the sink is approximately 1D-4D downstream, and more particularly in some embodiments, the sink is located 2D downstream of each turbine center [1]. The range of 1D-4D for placement of a sink can be a suitable placement for a sink according to some embodiments, because there can be a complex wake region extending over approximately 2-4 diameters downstream of a wind turbine. The wake in this region can be due to a relaxation of axial and radial pressure gradients due at least in part to an extraction of energy from turbine, which can cause the centerline velocity to drop. A minimum centerline velocity can be reached between 1D-2D downstream, beyond which the velocity begins to recover [1].

In some embodiments, the model according to embodiments herein described can be used to predict air flow about larger turbine arrays. In these embodiments, the algorithm as described herein can be modified to account for linear decreases in a centerline flow velocity to values below zero for predicted arrays having larger numbers of turbines (See e.g. FIG. 8).

In these embodiments, an iteratively defined strength model can be used wherein strengths of the vortices and sinks for each turbine can be estimated to be proportional to the incoming velocity raised to a numerical power; that is, if the incoming flow velocity to turbine j is given by $v_j$, then $\Gamma_j \propto a v_j^x$ and $q_j \propto b v_j^y$ where a,b are some constants of proportionality and x,y are numerical exponents. Similarly the strength of the dipole for each turbine can be estimated to be proportional to the incoming velocity: $\mu_j \propto c v_j^z$, where c is some constant of proportionality and z is a numerical exponent. In this example, using these proportionalities with x, y=3 and z=2, the four variables of the model are then three constants of proportionality and the strength of the sources in a field array.

In these embodiments, the algorithm can use iteration between determining the strengths of the elements and the flow field velocities, which can be more computationally intensive than a homogenous strength model. Using iteration as described here can result in more accurate predictions for larger arrays.

A matching of simulated data to provide a model of potential flow is now described by way of example.

A first step in matching simulated data can be to average the simulated data over a simulated time span in order to obtain a time-averaged flow pattern. In some embodiments, a time-varying potential flow model can be used in place of a time-averaged flow pattern.

Depending on resolution of the simulated data, a further step in the matching of simulated data can comprise down sampling the simulated data to a lower spatial resolution to simplify computations. An exemplary simulated flow field for a single WINDSPIRE® turbine is shown in FIG. 6.

In some embodiments, a wake region and surrounding region of the flow field can be modeled with separate potential flow models. For example, if a single potential flow model does not provide results having a desired level of accuracy (e.g. as evaluated by an RMS between the simulated field and the modeled field), then the wake region and surrounding region can modeled with separate potential flow models.

In embodiments using simulated turbine data, the number of variables can be reduced by assuming one vortex and one dipole at the center of each turbine.

The fitness functions for the surrounding region and the wake region can be designed differently in order to emphasize different characteristics of the flow. For example, differences between the simulated and modeled flow velocities downstream, where another turbine might be placed, can be considered to be more important in terms of a matching than other regions of the flow. As another example, in some embodiments, it would be less important to have the simulated data match the modeled flow velocities in direct proximity to a turbine where another turbine would not be placed. Other features for modifying a fitness function according to various regions within an array would be understood and identifiable by a skilled person upon reading the present disclosure.

In some embodiments a model can be evaluated and compared to other models by taking the RMS differences (for each flow direction) between an average at cross sectional slices of the simulated field and the modeled field.

According to some embodiments, models based on simulated data, using a vortex and dipole at the center of each turbine and a plurality of free-floating sources/sinks rather than a source field and fixed sink provides a better match between the simulated and the modeled flow field (See e.g. Example 6).

In some embodiments, the variables for which optimization is performed can be fixed prior to model parameter optimization. Even in some of these embodiments, the number of variables can still be significant and a grid search algorithm can become computationally unfeasible as the number of variables increases. Therefore, in some embodiments a genetic algorithm search can be used locally optimize model parameters.

Other local optimization algorithms can also be used without departing from the scope of the present disclosure. The exact structure of the optimization algorithm is not necessarily relevant to the overall operation of the presented algorithms. Other algorithms suitable for optimization of model parameters are identifiable by a skilled person, such as grid-search algorithms, gradient-based algorithms, the surrogate management framework, and simulated annealing, for example. These algorithms can have varying degrees of speed and accuracy. Therefore, a selection of one of these algorithms to be used according to embodiments of the present disclosure can be based on whether it is desired to have a higher speed algorithm or whether it is desired to have an algorithm which can provide a higher accuracy.

Steps which can be performed in a genetic algorithm are now described, by way of example and not of limitation, and the following description is adapted from MATLAB® documentation [13].

A genetic algorithm can begin by creating a random initial "population". An "individual" as used herein, refers to a set of numbers, one number for each variable of a problem. A population then refers to a group of individuals. The algorithm can then create a sequence of new populations.

At each step, the algorithm can use the individuals in a current generation to create a subsequent population. To create a new population, the algorithm can perform, for example, the following steps: scoring each member of the current population by computing its fitness value (using a fitness function written by a user specially adapted for the optimization); scaling raw fitness scores to convert them into a more usable range of values; selecting members, called parents, based on their fitness; choosing "elite" individuals in the current population that have lower fitness; passing elite individuals on to the next population; and producing children from the parents.

Children can be produced, for example, either by making random changes to a single parent, referred to as "mutation" or by combining vector entries of a pair of parents, referred to as "crossover". Any current population can be replaced with children to form a subsequent generation.

The algorithm can be set to stop when one or more selected stopping criteria are met. Stopping criteria can include but is not limited to: a number of generations produced, a limit on an amount of time, a population fitness value being below a set limit, and/or having no significant change over a set number of generations or amount of time.

Controllability of the algorithm parameters can depend on the particular software that used to perform the algorithm. In some embodiments herein described, MATLAB® Global Optimization Toolbox software is used. In this software, almost all of the algorithm parameters can be controlled (see online documentation for full details [13]).

According to some embodiments, the algorithm parameters can be controlled based on a desired outcome of the algorithm. These parameters include but are not limited to factors as mutation rate, cross-over rate, elite/parent selection, seeding algorithm, number of populations and subpopulations to use, and termination conditions. Such factors can affect the speed and accuracy of the genetic algorithm optimization. Adjustments to these parameters can be made in the modifying the definition of the genetic algorithm. For example, an algorithm can be seeded in order to input a solution (e.g. a configuration of turbines) which is known and/or expected to be a good solution (e.g. a configuration of turbines having one or more of a desired attribute) as a starting point. The parameters used in the genetic algorithm can determine the method by which the variables are searched over (e.g. having a method which can have a higher computational speed or having a method which can provide better accuracy). For example, a higher mutation rate can mean that there are more jumps from one solution to another rather than small improvements. Therefore, increasing the mutation rate can help to avoid getting caught in a more locally optimized solution, rather than a more globally optimized solution. Therefore, there can be trade-offs in changing each of the genetic algorithm parameters, which can affect how genetic algorithm progresses.

In some embodiments, the method providing a low-order potential flow model according to the present be a computer-implemented method, for example a computer-implemented method, which can execute, using on more computer systems, executable instructions to perform one or more of the steps herein described. For example, the steps can be implemented in hardware, software, firmware or combination thereof.

Features described as blocks, modules or components can be implemented together (e.g., in a logic device such as an integrated logic device) or separately (e.g., as separate connected logic devices).

Figure 23A:
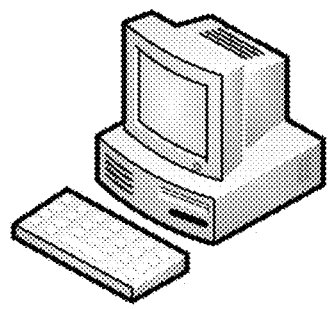
FIGS. 23A-B show schematics of exemplary computer systems that can be used to carry out computer-implemented methods according to the disclosure.
Figure 23B:
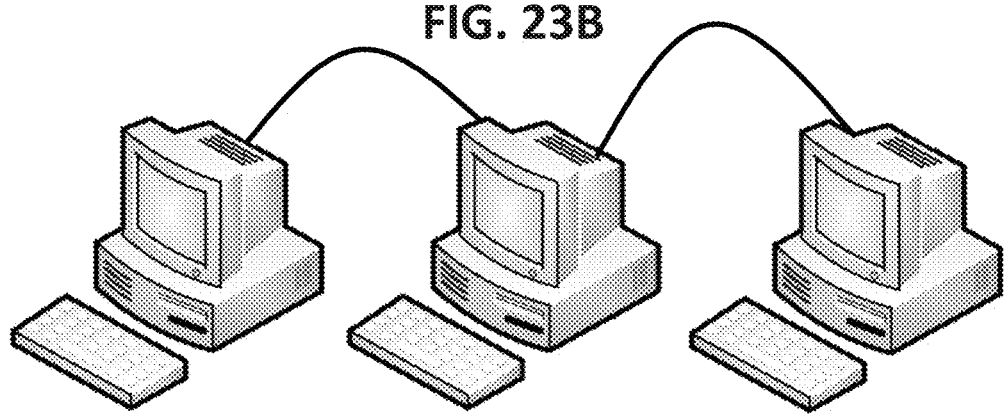

The methods according to the disclosure can be performed, at least in part, on a single computer (See e.g. FIG. 23A) or by parallel processing with two or more computers as shown schematically in FIG. 23B.

A software portion of the methods of the present disclosure can comprise a computer-readable medium which comprises instructions that, when executed, perform, at least in part, the described methods. In particular, according to some embodiments, software that is capable of implementing a genetic algorithm can be used, for example, MATLAB®, SCILAB®, and Octave. According to some embodiments, the genetic algorithm can be written by a user, for example using a programming language. Programming languages suitable for performing the genetic algorithm according to embodiments herein described include but are not limited to C/C++, Java, Python, and Fortran.

In some embodiments, the instructions, when executed, perform at a step of receiving acquired flow data around a selected VAWT, for example, by receiving input from a user.

In some embodiments, the instructions, when executed, perform a step of adopting one or more of the selected VAWT to serve as a model. The step of adopting one or more of the selected VAWT can be performed, for example, based on input from the user.

In some embodiments, the instructions, when executed, perform a step of assigning one or more variables corresponding to a set of potential flow elements, for example, a rotational ($\Gamma$) potential flow element, a blockage effect ($\mu$) potential flow element, a potential flow element representing energy taken in by the VAWT (q or $q_{sink}$), and a potential flow element representing turbulence (q or $q_{source}$). In these embodiments, the variables can be input by a user or can be performed by the software.

In some embodiments, the instructions, when executed, perform a step applying an algorithm to the one or more variables. In these embodiments, the algorithm is configured to output values for each of the one or more variables which match the acquired flow data around the selected VAWT according to a fitness function to provide values for each of the one or more potential flow elements representing potential flow around the selected VAWT. In these embodiments, the fitness function can be input by a user or can be selected by the software from a plurality of set fitness functions included in the software.

The computer-readable medium can comprise, for example, a random access memory (RAM) and/or a read-only memory (ROM).

The instructions can be executed by a processor (e.g., a digital signal processor (DSP), an application specific integrated circuit (ASIC), or a field programmable logic array (FPGA)).

By way of example and not of limitation, as shown in FIGS. 22A-B, the methods of the present disclosure can be implemented in a computer system (30) and more particularly, can be implemented in computer system (31) comprising a memory (32), a processor (33), a communications interface (34) and an interconnection arrangement (35) coupling the memory, processor and the communications interface, wherein the memory is encoded with instructions for executing one or more steps of the methods of the disclosure.

The present disclosure allows, in some embodiments, a method for configuring an array of vertical axis wind turbine (VAWTs) for an array site based on a desired one or more attributes of the array, for example, based on power generated by the array per unit land area, an environmental impact, social, acoustic, visual impacts, or radar presence.

In some embodiments the method of configuring the array can be a computer-implemented method, for example a computer-implemented method, which can execute, using on more computer systems, executable instructions to perform the steps herein described.

The method comprises providing data corresponding to potential flow around a selected VAWT. In embodiments wherein the method is computer-implemented, the method can execute, using on more computer systems, executable instructions to perform a receiving of input data corresponding to potential flow around the selected VAWT. The input data, for example, can be from the low order potential flow model according to embodiments herein described.

The method further comprises selecting one or more input variables, the one or more input variables representing at least one of a parameter of the array site, a constraint of the array site, a parameter of the VAWT, and a constraint of the VAWT. Parameters of the VAWT can include but are not limited to, diameter, a number of blades, rotational speed, and operative incoming wind speeds. Constraints of an array sites can include, but are not limited to, where the turbines can be positioned, the topography of the array site, and incoming wind flow directions and predominance. Other constraints of the array site are identifiable by a skilled person.

In embodiments wherein the method is computer-implemented, the method can execute, using on more computer systems, executable instructions to perform a receiving of the one or more input variables representing the at least one of a parameter of the array site, a constraint of the array site, a parameter of the VAWT, and a constraint of the VAWT.

The method further comprises selecting a number of VAWTs to be configured in the array. In embodiments wherein the method is computer-implemented, the method can execute, using on more computer systems, executable instructions to perform a receiving input concerning a number of VAWTs to be configured in the array. The number of VAWTs to be configured in the array can be selected simply based on a number available or, for example, based on space available in an array site.

The method further comprises receiving input concerning one or more of a desired attribute of a configured array site. In embodiments wherein the method is computer-implemented, the method can execute, using on more computer systems, executable instructions to perform a receiving of input concerning one or more of a desired attribute of a configured array site. For example, the array site can be configured for power output.

In some embodiments, the method further comprises designing a fitness function configured to rank configurations of array sites within one or more constraints of the array site. For example, the fitness function can be designed to evaluate each possible array configuration with respect to set criteria and from this evaluation a quantified rank of how good the array performs with respect to these criteria can be generated. As a further example, the fitness function can rank configurations of each possible array site according to a threshold determined by a user. A threshold can be set according to a desired attribute of a configured array site, for example, power output.

In other embodiments, the method of configuring the array can be a method based on recursive manual computations. Such a method can in some embodiments take substantially longer to perform compared to computer based computations.

In some embodiments, a fitness function can be written such that the sum of the wind incoming into each turbine ($\Sigma_{i=1}^{k} u_{\parallel}$) is maximized. The fitness function can be described as a set of rules which can be configured to reward one or more attributes of a system which are considered to be desirable by a user with a high quantified rank and giving a lower quantified rank to a system having the one or more desirable attributes to a lesser extent and/or having one or more attributes considered to be undesirable by the user. Therefore a fitness function can be controlled in order to optimize, at least locally, for a combination of desired attributes.

The fitness function, according to some embodiments, can also be described as a function that takes a position of a turbine in an array as input, operates on that input in a set manner, and outputs a value, for example, a single number. In these embodiments, the number, in connection with other numbers or values obtained for a particular configuration of turbines in an array, can be used to rank the configuration of turbines in the array and compare to other configurations. Therefore, changing the fitness function from one optimization of a configuration of turbines to another optimization comprises altering the operations performed on the input. For example, the fitness function can be set to penalize (e.g. by subtracting a set amount from the value to be output by the fitness function) a configuration of turbines which is considered by a user to have a undesired attribute and/or to reward (e.g. by adding a set amount from the value to be output by the fitness function) a configuration of turbines which is considered by a user to have a desired attribute.

In embodiments herein described, a user can select any one of the ranked configurations, for example, to be used in arranging an array of turbines. The user can selected a highest ranked configuration, which can be considered to be a locally optimized configuration, or the user can select another configuration among the ranked configurations, which can be considered as not being locally optimized. Methods for arranging turbines in an array will be understood by a skilled person.

By way of example and not of limitation, if a desired array site is on the side of, and including the crest of a hill, it can be desired to optimize both for power output of the turbine array and for keeping turbines off of the crest line in order to reduce visual impact. In this example, the fitness function, for each possible array, can be set to sum the wind incoming to each turbine (cubically proportional to power) and can also be set to subtract a fixed amount for each turbine on the crest line. Depending on what the fixed amount is set to be subtracted for each turbine on the crest line is, a balance can be found between a high power output and a minimal visual impact.

As another non-limiting example, if it were known and/or found that a solid line of closely-spaced turbines is difficult for birds and bats to avoid while flying, the fitness function can penalize by a set amount, a configuration of turbines that comprises the solid line of turbines in comparison to a configuration of turbines that does not comprise the solid line of turbines. In this example, the fitness function can be set to subtract a fixed amount for any such the solid line of turbines in an array configuration. In some embodiments, a configuration of turbines which is penalized in this way, can still be balanced against another desired feature, such as a low radar profile.

As further non-limiting example, if it is known and/or found that a certain turbine configuration provides an acoustical resonance that disproportionately increases the acoustic signature that turbine configuration, a fitness function can penalize an array which comprises that configuration within the overall configuration of the array. For example, if a three-turbine triangular configuration exhibits acoustical resonance that disproportionately increases the acoustic signature of the three turbines, the fitness function can be designed to penalize an array having the turbine triangle. In particular, the fitness function can be designed to penalize the turbine triangle in accordance with the position of the turbine triangle with respect to a residential area. In particular, the fitness function can be designed to increase the penalty with a decreasing distance of the turbine triangle from the residential area and accordingly decrease the penalty with an increasing distance of the turbine triangle from the residential area. In this way, the array would be quiet in regions where acoustics mattered, but can be more power efficient in regions where acoustics did not matter.

For design of a fitness function for configuring an array of vertical axis wind turbines (VAWTs) according to some embodiments, it can be estimated that $P \propto u_\parallel^3$ and the power coefficient, $C_p$ can be defined [5] as:

$$C_p = \frac{P}{(1/2)\rho A U_\infty^3} \quad (14)$$

where P is the power output of the turbine, $\rho$ is the air density, A is the area swept by the rotor (equal to turbine diameter times turbine height), and $U_\infty$ is the free-stream wind speed. Extending this analysis to an array of k turbines yields:

$$C_{p,array} = \frac{\sum_{i=1}^{k}(P_i)}{(1/2)\rho \sum_{i=1}^{k}(A_i)U_\infty^3} \quad (15)$$

Similarly, in order to compare the performance of an array of k turbines to the performance of k isolated turbines, the normalized coefficient (denoted for simplicity as $C_p'$) according to some embodiments can be considered to be:

$$C'_{p,array} = \frac{C_{p,array}}{k * C_{p,iso}} \quad (16)$$

$$= \frac{\sum_{i=1}^{k} P_i}{P}$$

In embodiments wherein the method is computer-implemented, the method can execute, using one or more computer systems, executable instructions to perform a receiving of input of a fitness function configured to rank configurations of array sites within one or more constraints of the array site, according to one or more set thresholds, the thresholds being set according to a desired attribute of a configured array site.

In some embodiments, the method further comprises applying an algorithm to the one or more variables, the algorithm configured to output data corresponding to locations of VAWTs, which provide the one or more of a desired attribute of the array of VAWTs. In embodiments wherein the method is computer-implemented, the method can execute, using one or more computer systems, executable instructions to apply an algorithm to the one or more variables, the algorithm configured to output data corresponding to locations of VAWTs which provide the one or more of a desired attribute of the array of VAWT units.

In some embodiments, in order to provide configurations of turbine arrays based on a desired one or more attributes of the array, a genetic algorithm which allows for optimization of variables over integers (e.g rather than over the real numbers) is used, for example, MATLAB® toolbox GEATBX® [9]. Other algorithms suitable for methods herein described are identifiable by a skilled person upon reading the present disclosure.

Configurations of turbine arrays herein described can be provided in consideration of a single prevalent airflow or in consideration of more than one prevalent airflow.

In some embodiments, the methods herein described can be used to optimize configurations of turbines at an array site for which there is more than one primary wind flow direction. For these embodiments, an array configuration can be ranked by the optimizing algorithm's fitness function based on its performance at each of the one or more primary wind directions. The array that performs the best over all of the one or more primary wind flow directions can then be ranked the highest. These embodiments can further take into account an importance of each wind direction. For example, if there are primary and secondary and/or lower importance incoming wind directions, the relative importance of each can be incorporated as a weighting of the fitness function. For example, the performance of the array for the one or more primary wind directions can be set to influence the ranking of the array to a greater degree than the performance of the array for the secondary and/or lower importance wind direction.

In some embodiments, the methods herein described can be used to predict how larger arrays of turbines will perform, for example, in terms of power output, compared to a smaller array, the power output of the smaller array being determined either experimentally or by simulation. For example, power output of a larger array can be determined based on the power output of an array having a smaller number of total turbines, but having a same arrangement of co-rotating or counter-rotating pairs, a same turbine-turbine spacing, and a same pair-pair spacing.

In some embodiments, a homogeneous strength model is used in predicting performance of turbine arrays and in others an iteratively defined strength model is used (See e.g. Examples 5-8).

In the homogenous strength model each of the turbines in an array can be assigned a same value of each of $\Gamma$, $\mu$, and q. In the iteratively defined strength model, each turbine in the array can be assigned a value of each of $\Gamma$, $\mu$, and q according to a respective location of each turbine in the array.

This iteratively defined strength model can be used in embodiments where a higher accuracy is desired. For example, particularly in the case of providing configurations of turbine arrays comprising more turbines than a number of turbines from which the model is derived, the iteratively defined strength model can be more accurate (See e.g. Example 7). The homogeneous strength model can be used in embodiments where shorter computation times are desired.

In embodiments where it is desired to provide configurations of turbine arrays comprising a number of turbines which is close to the number of turbines on which the model is based, there homogeneous model can provide accuracy substantially equivalent to that of the iteratively defined strength model. In some embodiments, the number of turbines used in the prediction can be double or triple the number used to develop the homogeneous strength model.

In embodiments where $\Gamma$, $\mu$, and q are modeled using simulated data, the homogeneous strength model can be used with substantially the same accuracy as the iteratively defined strength model (See e.g. Example 8). In embodiments where $\Gamma$, $\mu$, and q are modeled using experimental data, a selection between the iteratively defined strength model and homogeneous strength model can be based on a desired computation time, a desired accuracy level, and/or a compromise between the two.

In some embodiments, in order to provide shorter computation times, the iteratively defined strength model can be used in conjunction with an extrapolation to determine performance of large arrays (See e.g. Examples 7-8). For example, the iteratively defined strength model can be used to predict a set of different array sizes and the data from each can then be normalized and extrapolated into much larger array sizes.

By way of example, and not of limitation, a centerline velocity can be calculated for 3×3 array, a 4×4 array, a 5×5 array, a 6×6 array, a 7×7 array, an 8×8 array, and a 9×9 array using the iteratively defined strength model. The centerline velocities can then be plotted and fitted to a trend line for extrapolation.

Figures 9A, 9B:
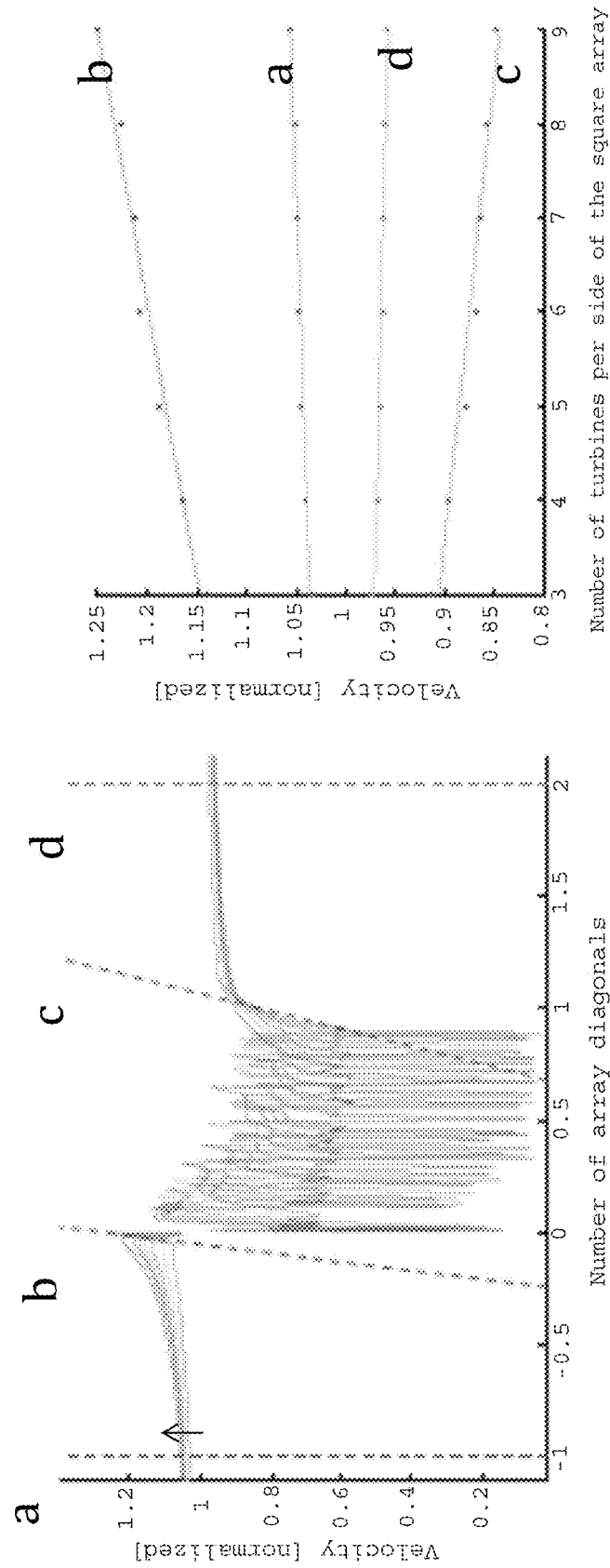
FIGS. 9A-B show plots representing empirical determination of scaling laws from experimental data. Velocity is normalized to the value measured experimentally immediately before the first turbine in the array.

In some embodiments, a linear equation can be used to fit the centerline velocities. In these embodiments, a least squares analysis can be used to estimate the accuracy of such extrapolation (See e.g. Example 7, FIGS. 9A-B).

In embodiments where $\Gamma$, $\mu$, and q are modeled using simulated data, configurations of large array sizes can be provided relatively quickly. For example, optimized array configuration for arrays of 100×100 turbines can be calculated in less than a minute.

In embodiments where the method of configuring an array is a computer-implemented method, the method can be performed, for example, on the same computers and systems described herein with reference to the method of providing a low-order potential flow model.

In these embodiments, the instructions, when executed, perform a step of receiving input data corresponding to potential flow around a selected VAWT. The input data can be, for example, the values for each of the one or more potential flow elements representing potential flow around the selected VAWT obtained from the method of providing a low-order potential flow model. The data can be input by a user or the software, if used in conjunction with the computer-implemented method of providing a low-order potential flow model, the software can be configured to retrieve and receive the data provided in the method of providing a low-order potential flow model.

In the computer-implemented method for configuring the array, the instructions, when executed, perform a step of receiving one or more input variables, for example, input variables representing a parameter of the array site, a constraint of the array site, a parameter of the VAWT, and/or a constraint of the VAWT.

In some embodiments, the instructions, when executed, further perform a step of receiving input concerning one or more of a desired attribute of a configured array site.

In some embodiments, the instructions, when executed, further perform a step of receiving input of a fitness function configured to rank configurations of array sites within one or more constraints of the array site, according to one or more set thresholds, the thresholds being set according to a desired attribute of a configured array site (18.2);

In some embodiments, the instructions, when executed, further perform a step of applying an algorithm to the one or more variables (18.3) configured to output data corresponding to locations of VAWTs which provide the one or more of a desired attribute of the array of VAWTs

EXAMPLES

The methods and systems herein disclosed are further illustrated in the following examples, which are provided by way of illustration and are not intended to be limiting.

Example 1

Obtaining Experimental Data

Eighteen turbines, nine counter-clockwise rotating and nine clockwise rotating were arranged in an array of counter-rotating pairs, spaced about 8 turbine diameters apart in each direction, as shown schematically in FIG. 1. In this example, the turbines were modified versions of a commercially available model from WINDSPIRE® Energy Inc. Each turbine was 10 m tall, had a diameter of 1.2 m and was connected to a 1200-W generator. The cut in wind speed of the turbines was 2.8 m s$^{-1}$. The turbine array was located in Antelope Valley of northern Los Angeles County, Calif., USA. The site is desert and the topography is flat for approximately 1.5 kilometers in all directions [5]. FIG. 1 shows a schematic of the field site.

Figure 2B:
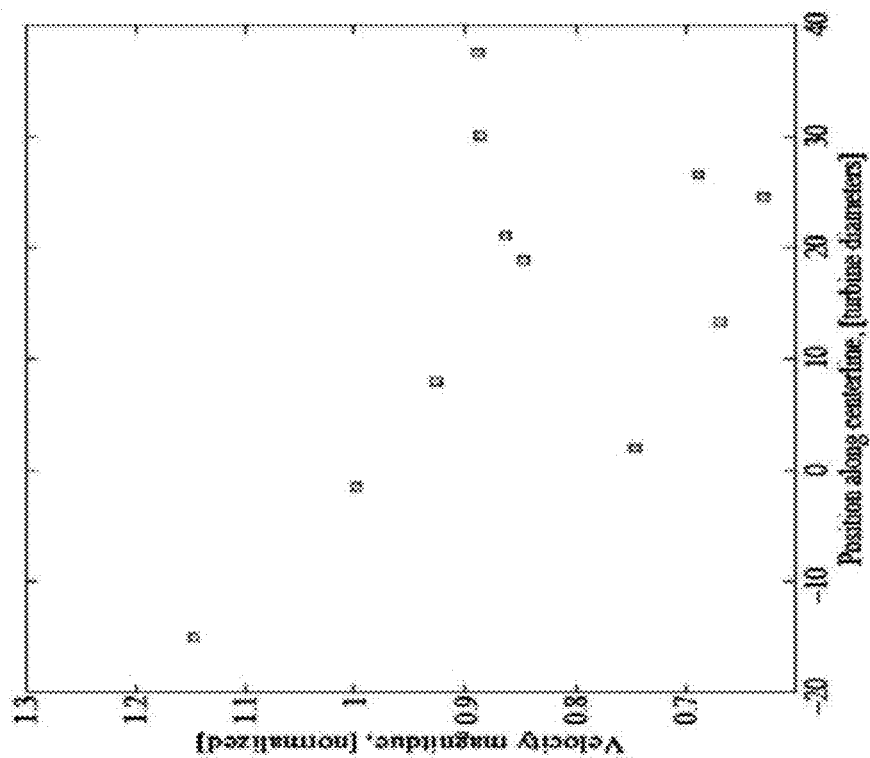
FIG. 2B shows a plot of experimental centerline velocity data.
Figure 2A:
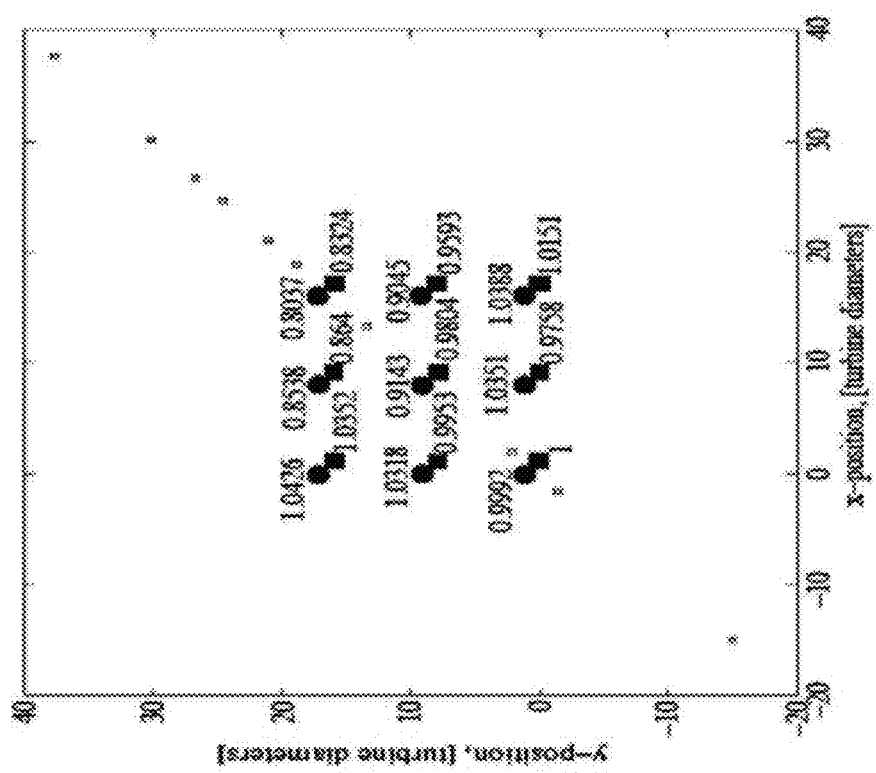
FIG. 2A shows a plot of experimental turbine velocity data. x indicates the horizontal (easterly) position, in turbine diameters. y indicates the vertical (northerly) position, in turbine diameters. Black circles represent counter-clockwise rotating turbine locations, black squares represented clockwise rotating turbine locations. The numbers next to each turbine are the values of $u_\|$, that is the velocity of the incoming wind, normalized to that of the first turbine in the array. The gray squares represent the locations of the centerline data measurements.

The electrical power generated by each turbine was monitored in real-time and recorded at 1 Hz using power meters connected to a central data logger (Campbell Scientific Inc.). Measurement accuracy was +/−5%. Additionally, a 10-m meteorological tower was consecutively placed at each of the gray squares in FIG. 2A. This diagonal through the array is referred to as the centerline of the array. The tower was left in each position for approximately 10 days. The accuracy of the 3-component sonic anemometer (Campbell Scientific Inc., CSAT 3) was +/−1%. Data from the meteorological tower were also recorded at 1 Hz using a datalogger (Campbell Scientific). The data was taken over four months over which time the average wind speed was approximately 7 m/s. Since the predominant wind direction at this site is from the southwest, the lower left hand corner of the array as presented in FIG. 1 was taken to be the origin of the coordinate systems as indicated.

In relating the power output of the turbine (P) to the flow conditions, it was estimated that $P \propto u_\|^3$ where $u_\|$ is the flow directed into the turbine (i.e. parallel to the free-stream direction). The measured data is presented in FIG. 2.

Example 2

Obtaining Simulated Data

In order to obtain a more complete flow field around the VAWTs to which to match a potential flow model, two-dimensional simulations of a single VAWT cross-section, a pair of co-rotating turbines, and a pair of counter-rotating turbines were completed. In this example, CFD simulation were obtained. In particular, the CFD software FLUIDICA® [12] was used. This software uses an immersed-boundary Navier-Stokes solver to compute the 2D flow around arbitrarily defined geometries. In this example, the geometry was made to closely resemble the cross-sections of the turbines used for the experimental data, which in this example are WINDSPIRE® turbines. Each turbine comprises three blades equally spaced to define a diameter of unit dimension, D. The chord length of each blade was approximately ⅛ D. The blades were approximated as flat plates at zero angle of attack with respect to the tangent of the defined (virtual) circle.

Before beginning the simulations, an adequate grid size and time step was determined to allow convergence of the flow. Five simulations were run using a single, stationary VAWT cross-section. The Courant-Friedrichs-Lewy (CFL) condition was used to determine the numeric stability of the simulation and was defined according to equation 13 as described herein.

For the simulation to be numerically stable, it is typically required in this example that CFL≤0.7. For the WINDSPIRE® geometry [12], all simulations in this example were run at CFL=0.25 and the absolute values of Δt and h were varied so that this ratio would hold. The non-dimensional values of h chosen were $1.27*10^{-2}$, $6.35*10^{-3}$, $3.18*10^{-3}$, $1.58*10^{-3}$, and $7.94*10^{-4}$. The maximum dimensional velocity of the system was conservatively taken to be the free-stream velocity plus the tip velocity of the rotating turbines plus a margin of error of around 0.5 m/s. In order to analyze convergence, the forces on one of the blades of the turbine were examined over time for each of the five cases. The result for the decomposition of the force parallel to the direction of the free-stream is given in FIG. 3.

Based on these results and in order to limit computational time, the simulations performed in this example were conducted using $h=3.18*10^{-3}$.

Figure 4:
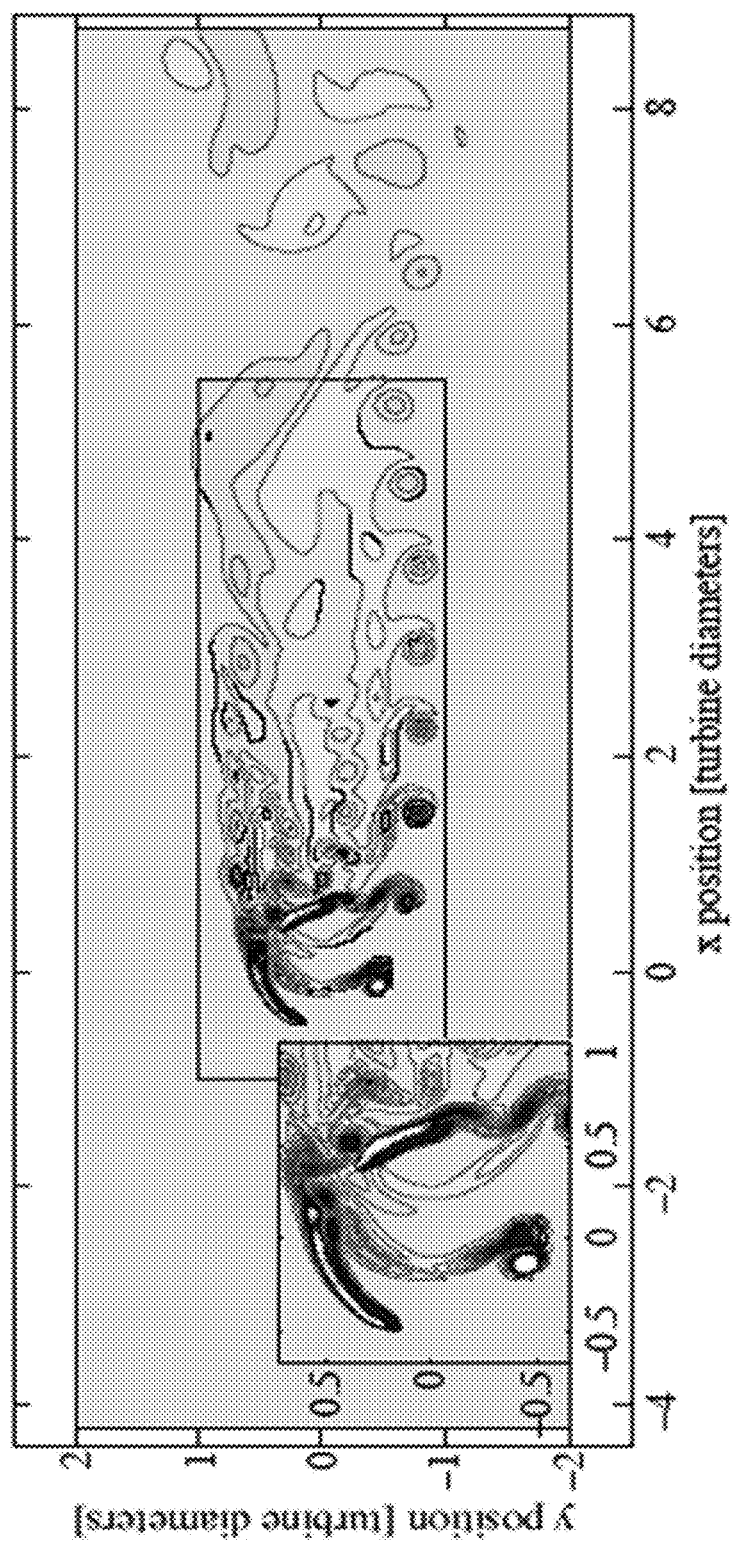
FIG. 4 shows a contour plot of vorticity from CFD simulation output for a single WINDSPIRE® turbine. The turbine is located at (0,0). The scale of vorticity is such that light gray indicates a small magnitude vorticity and dark gray indicates a higher magnitude vorticity. The inner rectangle indicates the boundary of the fine grid level. This frame of the flow was taken at non-dimensional time, t=10.

The final WINDSPIRE® simulations were run with two grid levels—a fine grid close to the turbine and a coarse grid over the entire simulated domain. The simulated area of the fine grid was taken to be 0.5 D in front of and to either side of the turbines and 5 D downstream of the turbines. The coarse grid was substantially larger: just over 3.5 D upstream, 1.5 D to either side of the turbine and about 8 D downstream. The simulations were run until the non-dimensional time of t=10. An example of the flow field as simulated is given in FIG. 4. In FIG. 4, the free-stream flow is moving in the positive x direction.

Example 3

Potential Flow Modeling

The potential flow models were generated from a set of elements including vortices, dipoles, and sources/sinks. Different numbers and arrangements of these elements were optimized for each model as described in Examples 4-6. The complex potentials (F) and the complex velocities (W=dF/dz) of the potential flow elements were calculated using equations 8-11 as already described herein and the velocity flow field u was calculated with equation 12.

Example 4

Potential Flow Modeling of a VAWT Cross-Section: General Approach Used in Examples 5 and 6

In order to generate a model, the number of each type of element, the position of each element, and the strength of each element in the potential flow was optimized such that the resulting flow field $u_{model}$ matched as closely as possible the original (acquired) data, either $u_{exp}$ (the acquired experimental data) or $u_{sim}$ (the acquired CFD simulated data). Even if some of these variables are fixed prior to the model parameter optimization, the number of variables can still be significant, resulting in a multidimensional optimization problem. A grid search algorithm rapidly becomes computationally unfeasible in these examples as the number of variables increases. For this reason, genetic algorithm searches were used in these examples to perform the model parameter optimizations.

For these optimizations, the MATLAB® Global Optimization Toolbox software was used. The following outline, drawn from MATLAB® documentation [13] summarizes how the genetic algorithm works:

The algorithm begins by creating a random initial population. An individual is the set of numbers, one for each variable in the problem). A population is a group of individuals).

The algorithm then creates a sequence of new populations. At each step, the algorithm uses the individuals in the current generation to create the next population. To create the new population, the algorithm performs the following steps: scoring each member of the current population by computing its fitness value (using a fitness function written by the user specifically for the optimization); scaling raw fitness scores to convert them into a more usable range of values; selecting members, called parents, based on their fitness; choosing "elite" individuals in the current population that have lower fitness; passing elite individuals on to the next population; producing children from the parents. Children are produced either by making random changes to a single parent—mutation—or by combining the vector entries of a pair of parents—crossover; replacing the current population with the children to form the next generation.

The algorithm stops when one of the stopping criteria is met: maximum number of generations or the time limit has been reached, population fitness value is below some predetermined limit, or there is no significant change over a predetermined number of generations or time limit.

Within the scope of software used in this example, almost all of the algorithm parameters are controllable (See online documentation for full details [13]). After examining the performance of some customizations, it was determined that the default parameters performed comparably and therefore optimizations in Examples 5-6 were run at default settings. The fitness function, however, was individually written for each optimization and is discussed in more detail in Examples 5-6. This approach can lead to non-determinism of the algorithm. Therefore, in these examples, in order to at least partially compensate for the non-determinism, multiple iterations of each optimization program were run as a partial check on the answers.

Example 5

Matching Experimental Data

Figure 5:
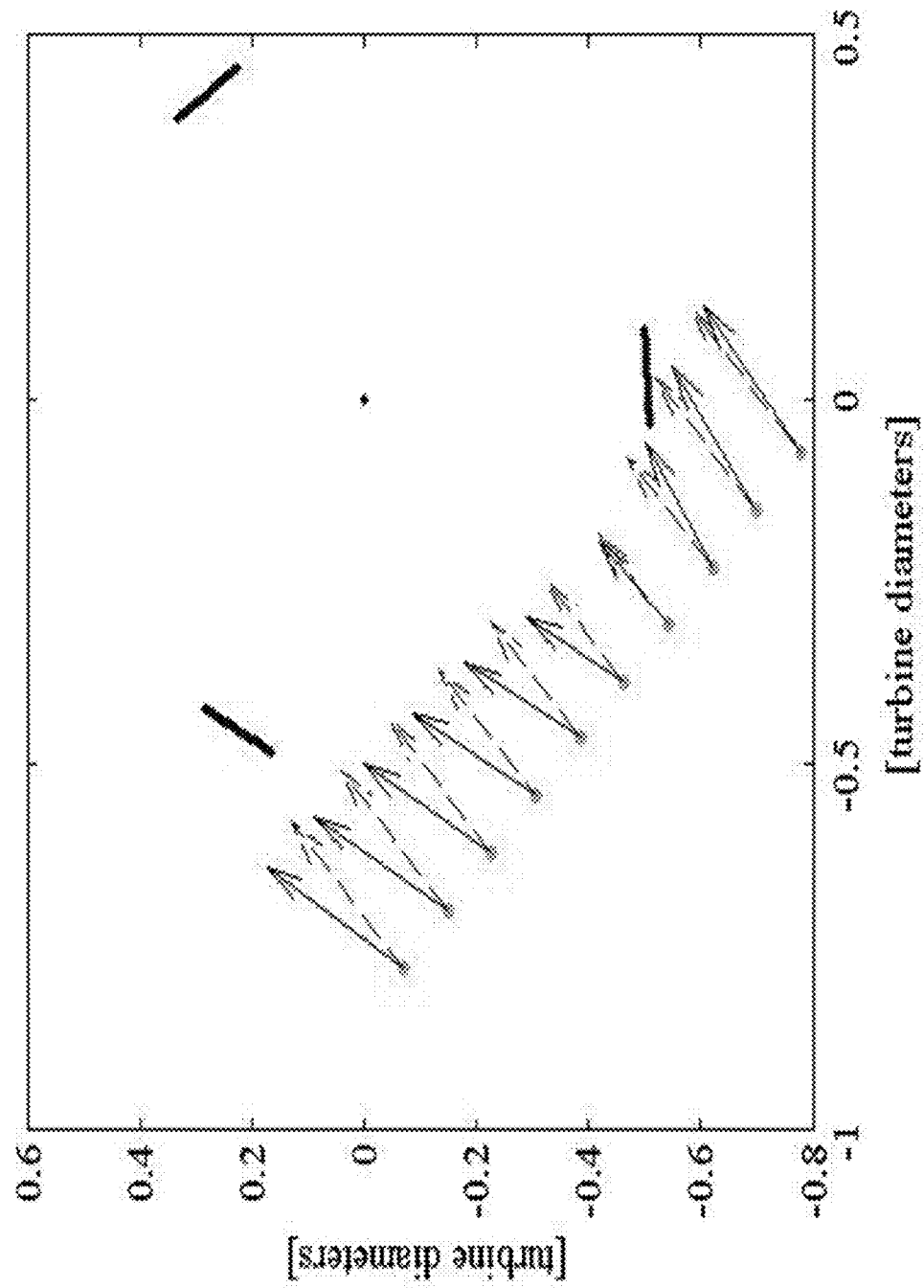
FIG. 5 shows a plot representing an analysis of cross-wind velocity into turbines. Here the bold lines represent the turbine blades, the dots mark the points at which the flow was analyzed (in actual tests, number was much larger), the solid arrows indicate the vector flow field at each point, and the dashed arrows indicate the component of the vector flow field "into" the turbine. The average of the magnitudes of the dashed arrows would define the flow velocity into the turbine, $u_\|$.

Ten different potential flow models were optimized and compared. The quality of each model was taken to be the root-mean-square difference between the experimental data points and the corresponding model data points. Thus in this example, the fitness function of the genetic algorithm was set to minimize this RMS difference. In matching the centerline data velocities from the meteorological tower measurements, the models were analyzed at points corresponding to the experimental test points and directly compared. In matching the experimental turbine velocity data (which was itself taken to be the cube root of the measured power data), a line of data points was taken perpendicular to the global free-stream direction and spanning from one edge of the turbine to the other. The data points were of adjustable distance from the turbine center, but in this example, the test points were placed 0.6 turbine diameters in front of the turbine center. The component of the potential flow perpendicular to this line (parallel to the global free-stream direction) was then determined at each of the test points and averaged in order to determine the flow velocity into each turbine as a single number, $u_\parallel$. This analysis is shown in FIG. 5.

For all models examined, a reduction of the number of variables was possible. All models in this example estimated that there was a vortex and a dipole at the center of each turbine. The models used here were either for a single turbine unit where the parameters of a single turbine were determined such that repeating that model at each turbine position yielded the best overall results or for a two-turbine unit where the parameters of a counter-rotating turbine pair was determined such that repeating that model at each turbine pair yielded the best overall results. In both cases, the number of vortices and dipoles were equivalent to the number of turbines included in each unit.

The sinks were either "free-floating" such that the position was optimized within a small box centered on the turbine(s) or were "fixed" such that the position was either predetermined or determined by modeled flow. The sources were either modeled as free-floating (within the same range as the sinks) or modeled as a source field over the entire array consisting of sources of equal strength placed in a regular grid (for these optimizations, the sources were separated by 0.25D in each direction and extended several D beyond the edges of the array in all directions.)

Physically, the vortex element models the rotational component introduced to the flow by the rotating turbine. The dipole accounts for blockage effects of the turbine itself. The sinks account for the extraction of energy from the wind by the turbine, while the sources simulate flow recovery due to entrainment of free stream flow in the wake. Perhaps more physically realistic than a single source is the application of a source field to simulate the inflow of air from above the turbine array [4]. For these models, a uniform field was assumed. In this example, the sink was placed 2D downstream of each turbine center based on examination of the velocity profile for a single isolated VAWT [1].

Figure 8B:
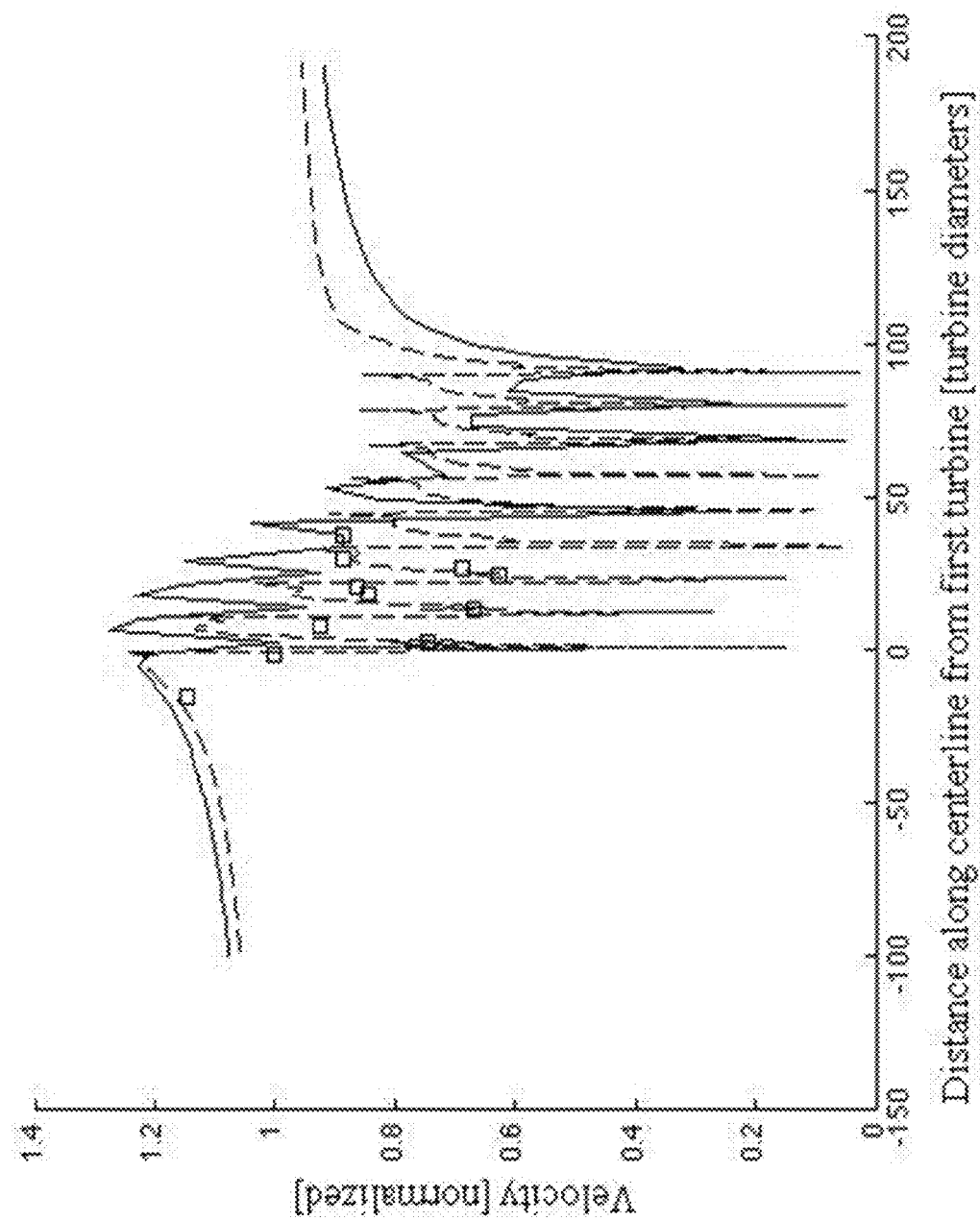

The best performing model in this example using a single turbine unit was composed of a vortex and dipole at the center of each turbine, a sink 2D downstream of the turbine center and a source field. This model yielded an RMS difference between all the data (both centerline and inflow) and the model of 0.66%. If the strengths of the vortex, dipole and sink are fixed to a single value for the entire array, the model was not able to directly extend in a reasonable fashion to larger arrays. The predicted flows for the larger arrays showed apparently linear decreases in the centerline flow velocity to values below zero. This result is shown in FIG. 8. A modification was therefore made to the algorithm. The strengths of the vortices and sinks for each turbine were estimated to be proportional to the cube of the incoming velocity; that is, if the incoming flow velocity to turbine j is given by $v_j$, then $\Gamma_j \propto av_j^3$ and $q_j \propto bv_j^3$ where a,b are some constants of proportionality. Similarly the strength of the dipole for each turbine was estimated to be proportional to the square of the incoming velocity: $\mu_j \propto cv_j^2$, where c is some constant of proportionality. The cubic proportionality of the vortex was estimated because ideally the vortex captures the rotation of the turbine which is proportional to the power output of the turbine which is proportional to the cube of velocity. Similarly, the sink ideally represents the wind power converted to electricity, which is also proportional to the power output of the turbine and therefore is also proportional to the cube of velocity. The dipole ideally represents the blockage effect of the turbine or the drag, which can be taken to be proportional to the square of the velocity. Using these proportionalities, the four variables of the model are then three constants of proportionality and the strength of the sources in the field. This process requires iteration between determining the strengths of the elements and the flow field velocities. Thus, this model is more computationally intensive than the homogenous strength model, however, in this example, it results in more realistic predictions for larger arrays—the centerline velocities dropped at a non-linear rate rather than a linear rate as distance from the beginning of the array increased and zero values were not attained. The RMS over all data points of model 7 was 0.69%.

Example 6

Matching CFD Data

The first step in the analysis of the CFD data was to average the data over the simulated time span in order to obtain a time-averaged flow pattern. Although a time-varying potential flow model can be used, it was believed that the response time of downstream turbines is longer than that of the short-term flow variations, therefore allowing the time-averaged flow field to be a good approximation of the flow in the array for this example. The next step in the analysis was to down sample the CFD data to lower spatial resolution, because it would have been computationally unfeasible to consider every grid point used in the CFD analysis in the final optimization. The resulting flow field for a single WINDSPIRE® turbine is given in FIG. 6 in which the uniform applied flow is moving in the positive x-direction.

FIG. 6 shows a higher density of data points to be matched in the near vicinity of the turbine. These points have been drawn from the fine CFD grid while all other points have been drawn from the coarse grid. The color variation of the flow vectors indicates how the flow field was divided for modeling purposes. After multiple attempts to model the flow field with a single potential flow model, the results were not satisfactory. Therefore the wake region and surrounding region of the flow field were modeled with separate potential flow models, albeit for consistency the same type of model (i.e. same number of each type of element) was used for both regions with only the fitness functions changed appropriately. As with the experimental data, the number of variables was reduced by assuming one vortex and one dipole at the center of each turbine. Again, "free-floating" indicates that the positions of the element can be optimized within a small box surrounding the turbine. In these cases the box extended 1.5D in the upstream (negative x direction) and in the directions perpendicular to the flow direction (positive and negative y-directions) and 2D in the downstream direction, where all distances are measured from the turbine center.

The fitness functions for the surrounding region and the wake region were slightly different in order to emphasize the different characteristics of the flow deemed important. Most importantly, any differences between the simulation and modeled flow velocities in the far downstream (e.g. where another turbine might be placed) were weighted to contribute more to the overall cost of the tested model than flow velocity differences in other regions of the flow. The weightings of the fitness functions were also designed to favor models that underestimated the downstream flow rather than overestimate it, in order to provide a conservative model.

The goodness of fit of a model was determined by taking the RMS differences (for each flow direction) between the average at cross sectional slices of the simulated field and the modeled field. The cross-sectional slices can be across the entire field, the band in front of and behind the turbine, and just the centerline of the system. In this example, the type of model used for both the experimental modeling which comprised a source field and fixed sink was not able to provide as good of a match as the source and sink free-floating cases. The difference in optimal modeling can be due to the discrete nature of the source field. Although the ideal field would be a continuous, uniform field, with the potential flow elements in use, only source terms at discrete locations can be used—in this case 0.25 D spacing in both directions. Although this method would work for the sparse data set taken experimentally, with the number of data points used in the CFD set, the positions of the source elements can lie very close to some test points and thus skew the flow. The net result would be that one disruption in the overall flow (i.e. a single free floating source) would provide a better fit to the CFD data than many sources each adding a disruption to the overall flow pattern.

Figure 7A:
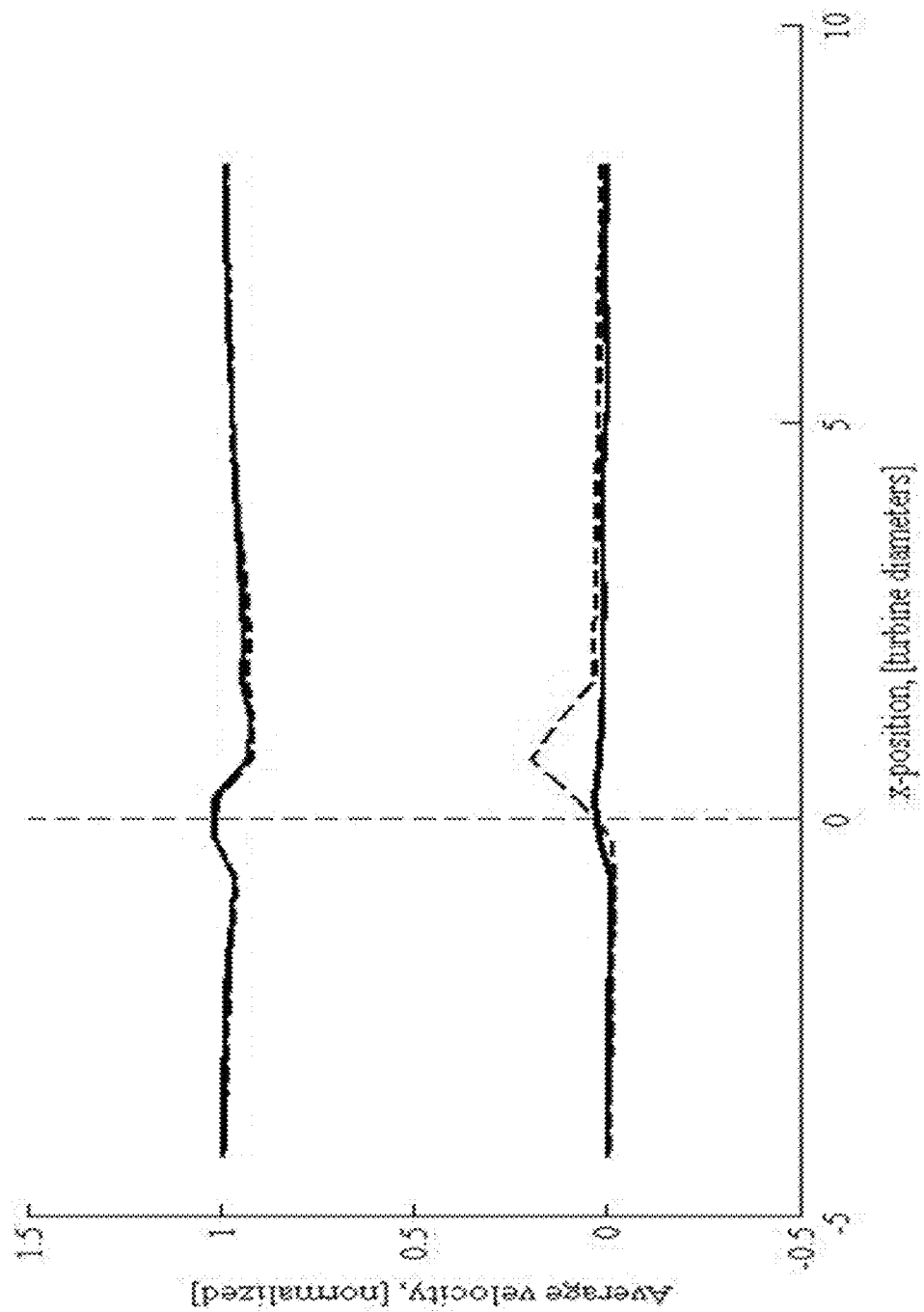
FIGS. 7A-C show a comparison of velocity flow field for WINDSPIRE® CFD simulation and fitted model. Black solid line indicates the x-component of the simulated flow, black dotted line indicates the x-component of the modeled flow. Gray solid line indicates the y-component of the simulated flow, gray dotted line indicates the y-component of the modeled flow. All velocities have been normalized to the incoming velocity to the turbine in the simulated flow.
Figure 7B:
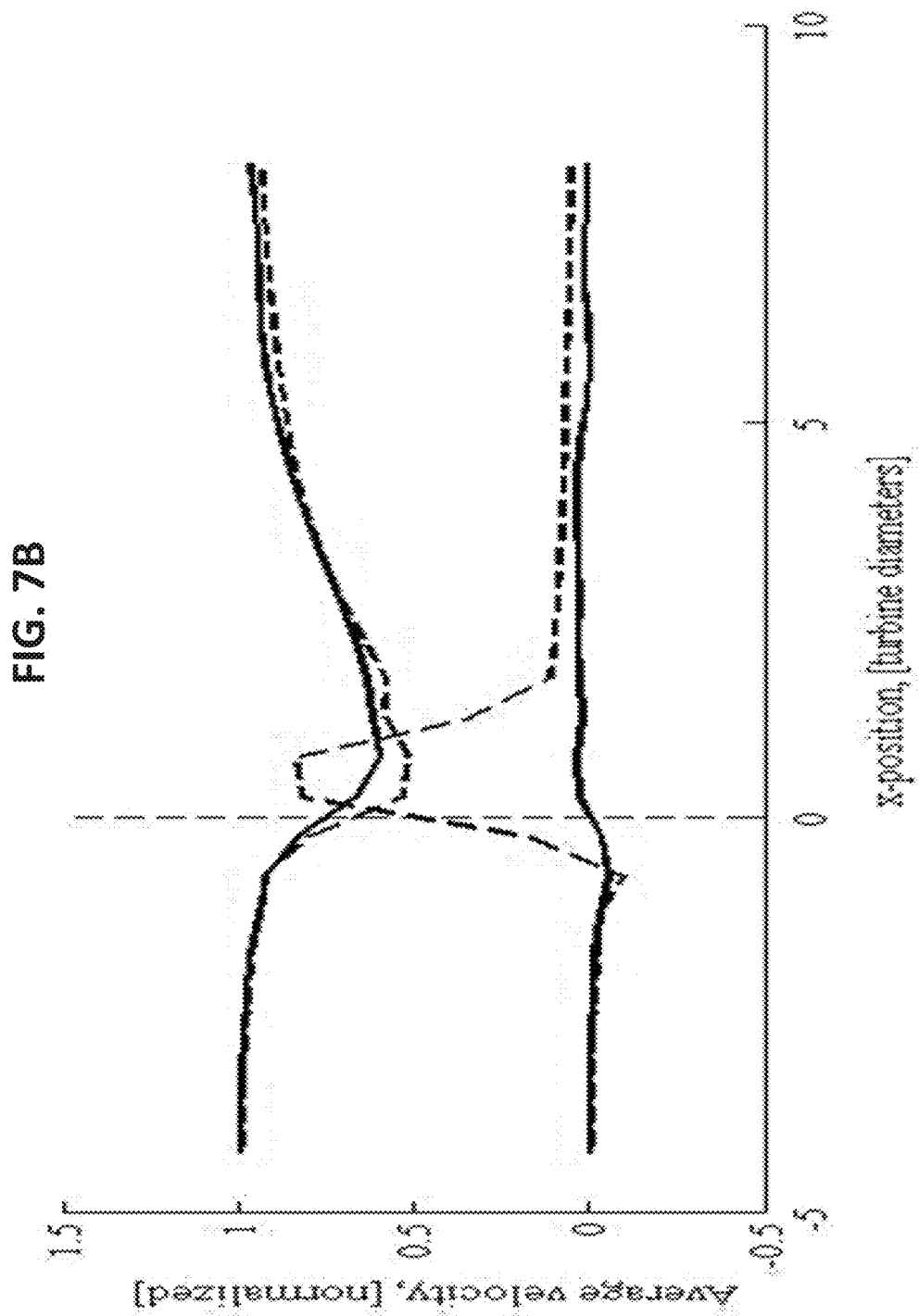
Figure 7C:
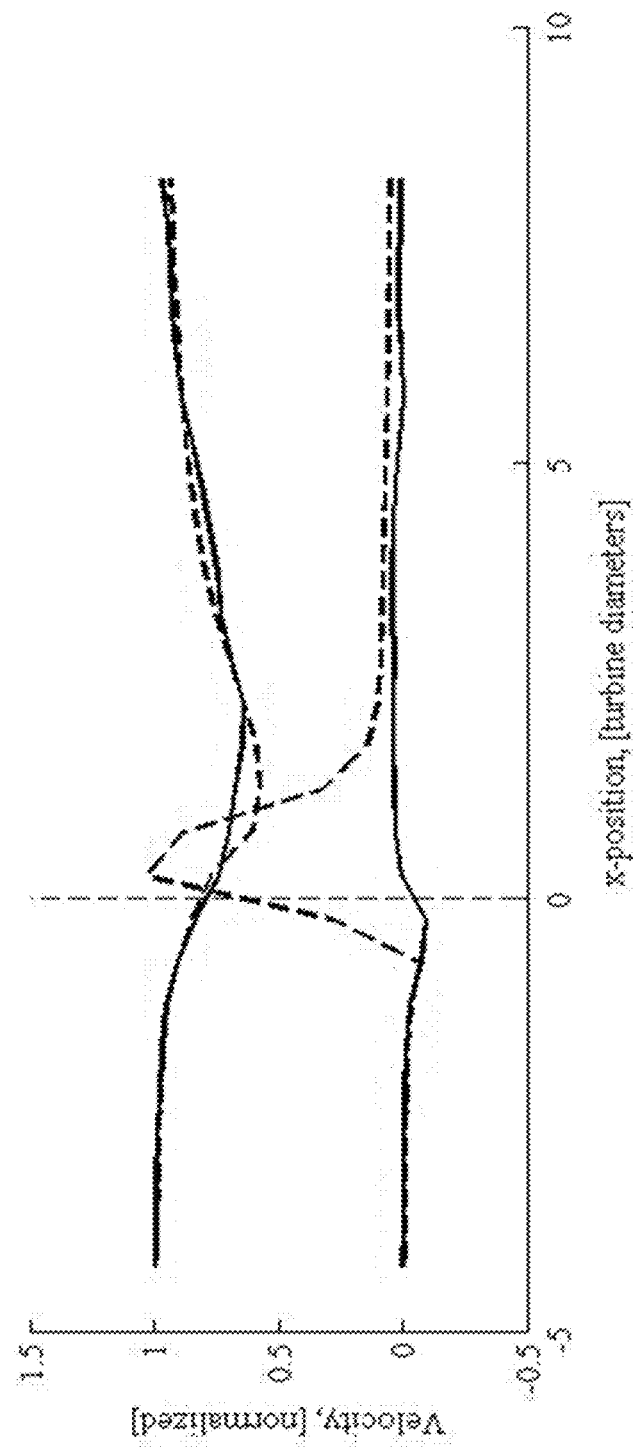

Models using a vortex and dipole at the center of each turbine and three free-floating sources/sinks (11 variables for a single turbine, 13 variables for turbine pairs) provided the overall best fits between the simulated and the modeled flow field in these examples and was thus used also in Example 8. A comparison of the average flows at cross-sectional bands for the simulated and modeled flows is provided in FIG. 7 for the single turbine.

Example 7

Results of an Experimental Data Model

In this example, it was estimated that $P \propto u_\parallel^3$. The power coefficient, $C_p$ was estimated with equation 14 as described herein. Rather than considering the absolute value of $C_p$, in these examples, the coefficient was normalized by dividing by the corresponding coefficient for a single isolated turbine (denoted $C_{p,iso}$) in order to yield $C_p'$. Extending this analysis to an array of k turbines provided equation 8, as also described herein. Similarly, in order to compare the performance of an array of k turbines to the performance of k isolated turbines, the normalized coefficient (denoted for simplicity as $C_p'$) was estimated with equation 9, also described herein.

$C_{p,array}'$ is used in this example as the primary means to compare different array configurations.

The first application of the experimentally-matched potential flow model was to examine the flow patterns of a larger version of the same type of array as that tested, i.e. the same counter-rotating pairs arrangements with the same turbine-turbine spacing and the same pair-pair spacing, but with a larger number of total turbines. For simplicity, these arrays are referred to by the number of turbine pairs there are on each side of the array (i.e. the experimental array is a 3×3 array.) The velocity profile along the centerline through the array was taken as a characterizer of the arrays.

As previously mentioned, the homogenous strength model performed well in matching the experimental data, however when the model was applied to much larger arrays, the results were deemed unphysical. Namely, the centerline velocity profile continued to decrease in magnitude from the front to the back of the array, and in very large arrays would even go negative (as shown in FIG. 8, left.) It is therefore not expected that the turbines where the flow is negative would continue to rotate with the same speed or even in the same direction as those at the front of the array and therefore the model used at the front of the array is expected not to be the same as that towards the back of the array. Therefore, the iteratively defined strengths model was developed, in which the strengths of the vortex, dipole, and sink of each turbine is directly dependent on the wind speed incoming into the turbine. As mentioned previously, however, this model required iteration between the strengths of the vortices, dipoles, and sinks and the velocity into each turbine in order for a converged, equilibrium state to be reached. Furthermore, if the initial guess as to the incoming flow velocity is too far off of the converged state, the model can become unstable and diverge from an equilibrium state. These requirements can be limiting in the size of an array that can be computed via this model. However, for what array sizes were computed in these examples, the centerline profile appears to be much more intuitively correct as the centerline velocity decreases at a decreasing rate from the front of the array to the back. In FIG. 8 (b), the homogenous strength and iteratively defined strength models are compared for a 9×9 array.

For arrays larger than 9×9, the iteratively defined strength model proved to be computationally intensive. It was therefore whether any relationships in the performances can be determined from the smaller turbine arrays and can allow an extrapolated prediction of the larger array performance. For this purpose, the iteratively defined strength model was used to compute the centerline velocity profiles for all square array sizes 3×3 to 9×9. The results were normalized by the corresponding dimension of the array along the centerline. Plotting all results yielded FIG. 9A. The dashed lines in FIG. 9A indicates the points at which specific values were taken from each of the arrays, in particular, one array length in front of the arrays, one turbine diameter in front of the arrays, one turbine diameter behind the arrays, and one array length behind the arrays. Because the centerline profiles were normalized to an array diameter, the relative size of one turbine diameter upstream/downstream changed for each array size, thus the dashed lines indicating these points are angled in FIG. 9A. Evaluating each array size at these marked points yielded the results shown in FIG. 9B and the data are fit with a linear equation. The $R^2$ values of the fits are 0.92, 0.97, 0.94, and 0.86, respectively. A nonlinear fit of the form $y=a-be^{-cx}$ was also attempted. The fit for the 1 turbine diameter upstream data and the fit for the 1 array length downstream were somewhat better than for the linear curve: $R^2$ values of 0.98 and 0.96 respectively, while the other two curves, the one array length upstream and the one turbine diameter downstream were essentially not fit, $R^2$ values of <0.001. In order to determine the more appropriate curve fit, data for larger arrays can be used.

From these results, it was observed that the increased incoming velocities with increasing array size caused the turbines at the front of the array to have higher individual power outputs. However, since the downstream velocities decrease with increasing array sizes, it can be concluded that the turbines in the far downstream are operating at a lower power output. Since the rate of increase in the upstream flows is approximately the same as the rate of decrease in the downstream flows, it can be estimated that the overall $C_{p,array}'$ will stay relatively constant as the number of turbines in the array is increased.

Another application of the developed model was to allow optimization of arrays of turbines. In this example it was desired to optimize the current field setup so that any final predictions can be experimentally verified. Thus, the optimization in this example was bounded by requiring 9 clockwise turbines and 9 counter-clockwise turbines be used and the turbines can only be located at discrete positions as indicated in FIG. 1. For these optimizations, the independently written genetic algorithms MATLAB® toolbox GEATBX® [9] was employed because it allowed optimization of variables over the integers rather than over the real numbers (unlike the MATLAB® Global Optimization Toolbox). The algorithms used by this software are the same as for the MATLAB® Global Optimization Toolbox, discussed previously. The fitness function of the optimization was written such that the sum of the wind incoming into each turbine ($\Sigma_{i=1}^{k} u_{\parallel}$) was maximized.

The array was optimized in this example for a single prevalent incoming flow direction, in this case, the southwest. The optimal arrangement was determined to be a "V" shape open to the incoming wind direction, as shown in FIG. 10. In this arrangement, a minimal number of turbines are directly in the wakes of other turbines. Note that all the counterclockwise turbines are grouped together on one side of the V and all the clockwise turbines are located on the other side of the V such that all turbines rotate from the outside to the inside of the V. Because co-rotating turbines are placed closely together in a line for this arrangement, it was expected that the airflow would be channeled along the inside and outside of the lines of turbines in such a way as to move with the turbines rather than pushing against them. Essentially, vortex sheets of turbines are created on either side of the V.

The performance of such an array when the airflow is not in the direction for which the array has been optimized was also considered. Computing the $C_{p,array}'$ value for the given array at intervals of 0.007 radians for the entire 360° range of possible incoming flow directions yielded the $C_{p,array}'$ verses flow direction curve found in FIG. 11. Note that in reference to the field array presented in FIG. 1, 0° corresponds to wind incoming from due north.

Figure 11:
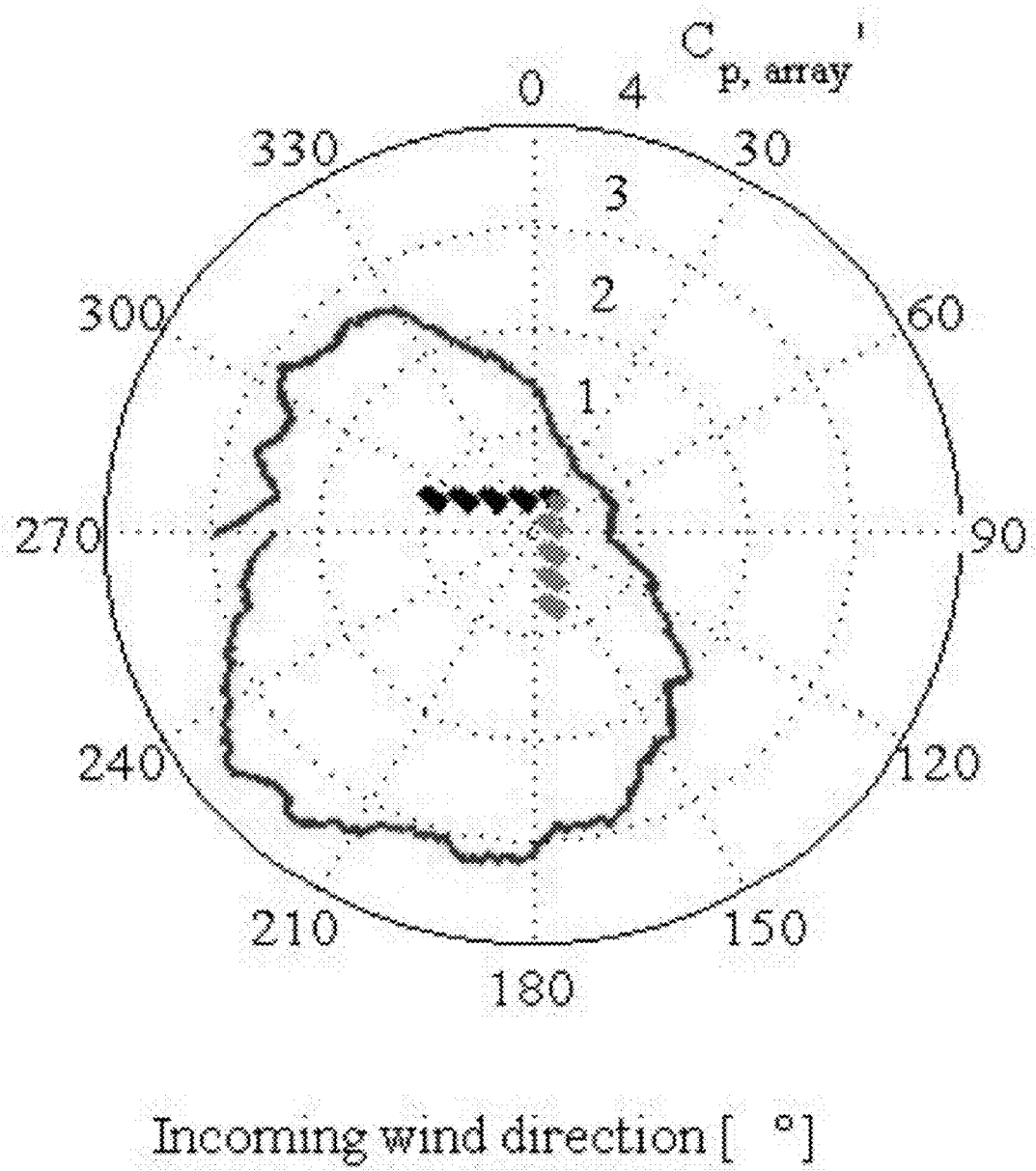
FIG. 11 shows a diagram showing performance of array optimized for single flow direction over a range of flow directions according to methods herein described. Gray dots represent counter-clockwise rotating turbines, while black dots represent clockwise rotating turbines. The circumferential axis is the angle in degrees from which the flow is coming. The radial axis is the value of $C_{p,array}'$ attained by the array when the flow is in the specified direction. The solid line represents the Savitzky-Golay filtered data using a polynomial of order 2 and a window size of 11 data points.

FIG. 11 shows that over a range of incoming flow directions of approximately 30° centered on the incoming flow angle for which the array was optimized, the array performed about 3.5 times better than the corresponding number of spatially isolated turbines. Over a range of approximately 90° degrees, centered on the optimized angle, the array performed at least 3 times better than an isolated array. It is important to note, however, that in a region spanning approximately 90°, centered on the incoming direction that is 180° from the optimized direction, the array performs worse than an isolated array. In FIG. 11, the solid line, indicates the computed $C_{p,array}'$ for each angle is very noisy. As described herein, for the iteratively defined strength model, an initial guess for the incoming wind can be made and then the strengths of the potential flow elements and the velocity field can be iterated over. The method by which the program makes an initial velocity guess and performs the ensuing iteration is non-deterministic. Thus some sharp variations from one angle to another can be present. The filtered curve presented in FIG. 11 likely can be considered to be a more reasonable approximation of the actual performance of the array. It is also noted that in a fully deterministic program, the $C_{p,array}'$ curve can be symmetric about the optimized angle due simply to the geometry of the array.

An optimization of the array given a uniform distribution of wind directions can also be performed.

Example 8

Results of a CFD Data Model

Figure 12A:
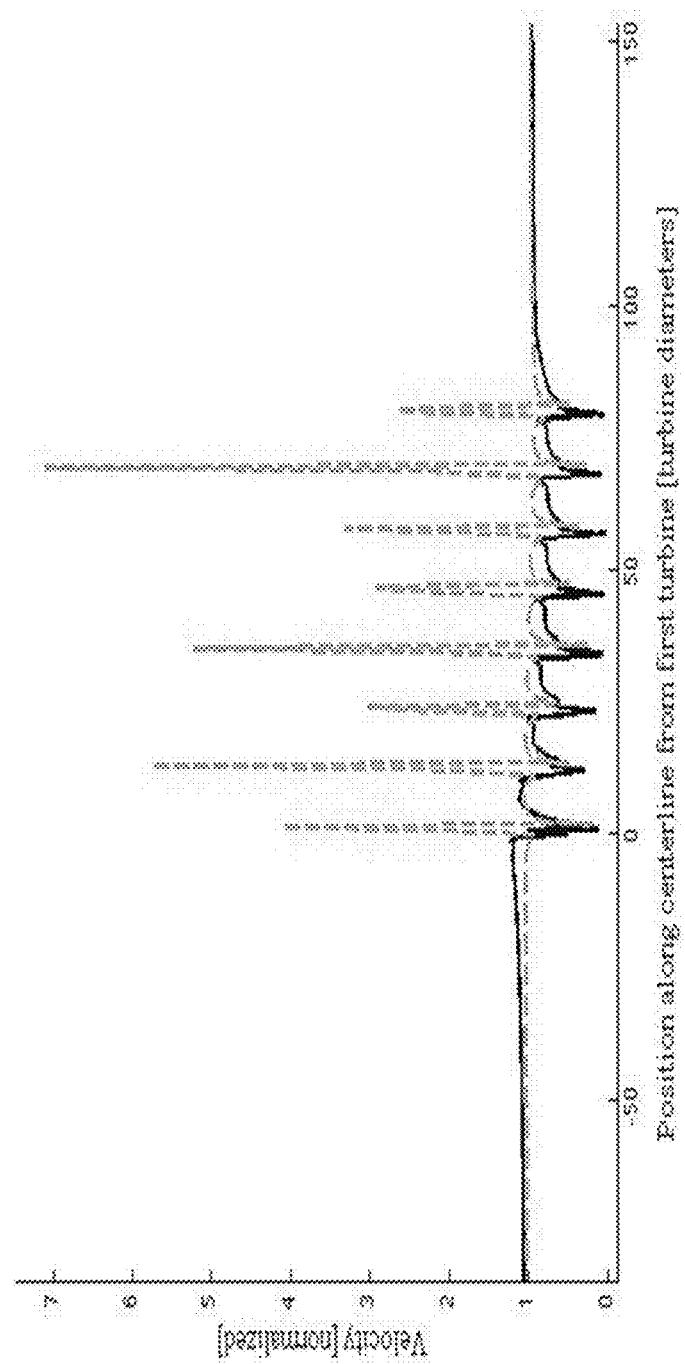
FIGS. 12A-B show plots comparing centerline velocities for an 8×8 turbine pair array as predicted by experimental and CFD derived models. The solid line indicates the experimentally derived model and the dashed line indicates the CFD derived model assuming each turbine is only affected by the wake of the turbine directly upstream.
Figure 12B:
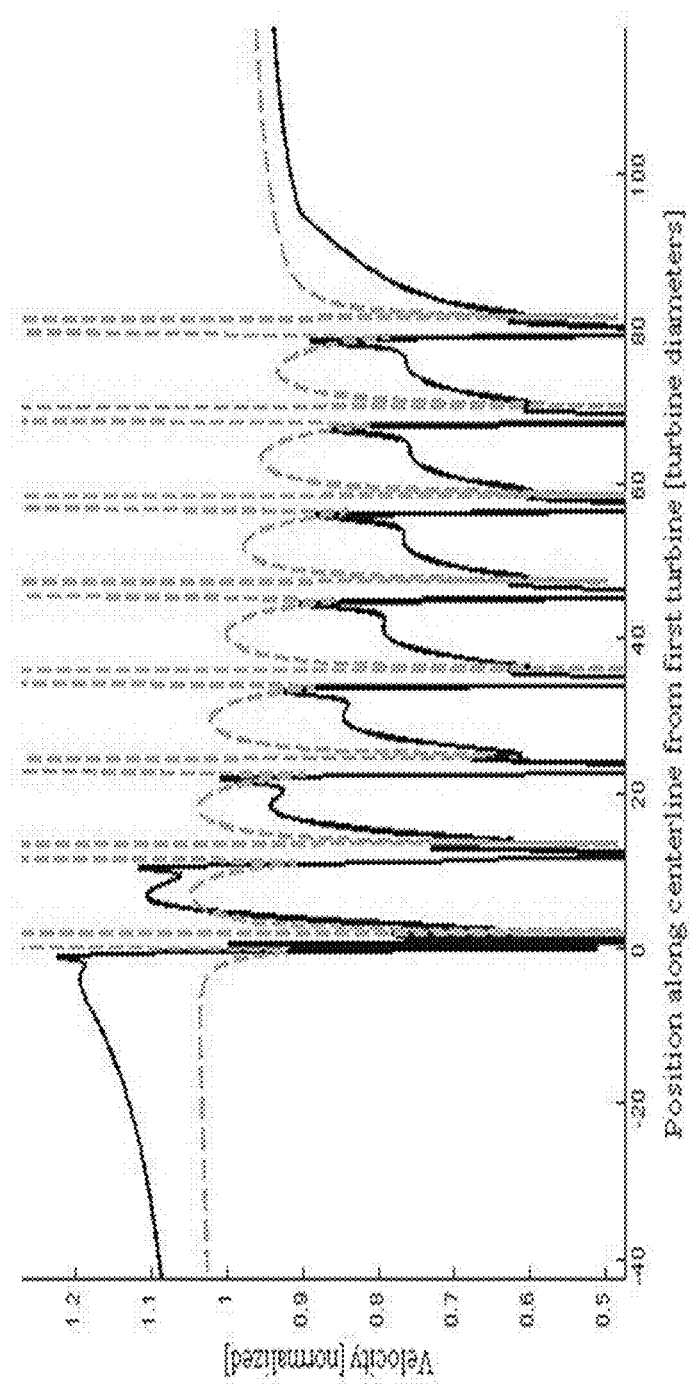

The first application of the CFD model was to examine the predicted centerline profile of arrays of counter-rotating turbine pairs to compare the results to the experimentally based model. The models in these examples were developed for isolated turbines or turbine pairs with a normalized incoming wind speed. In placing them in an array, two approaches were taken: the first approach assumed homogeneous turbines throughout the array, while the second approach calculated the flow in front of a turbine due only to the wake of the turbine immediately in front of it. These two approaches and the results of the experimental model for the same sized array are compared in FIG. 12.

There is minimal computational time difference between the two approaches to the array evaluation, therefore the second approach, which assumed influence from directly upstream turbine wakes, was selected for further analysis in this example since it proved to be a slightly closer match to the experimentally derived model predictions. The computation time for the CFD model was very rapid—typically even the computations for arrays as large as 100×100 turbine pairs took only a few tens of seconds. This is in contrast to the computation time required by the experimentally derived model which required, in some examples, tens of minutes to compute arrays as large as 9×9 turbine pairs and it was not computationally feasible to compute larger arrays. The time difference can be due to the experimental model's requirement in some cases for iteration.

With the ability to compute the larger arrays more rapidly, it was considered if any velocity trends became apparent between arrays of different sizes. Again, arrays of different sizes were computed and normalized by the array diameter. Comparisons of the velocities were then considered at set points along the centerline: 1 array diameter upstream, 1 turbine diameter upstream, 1 turbine diameter downstream, and 1 array diameter downstream, as indicated in FIG. 13.

Although exponential fits were attempted for this data, linear fits proved to have far higher $R^2$ values than the exponential fits. A summary of the $R^2$ values for the linear fits and the coefficients of the fits for both the experimental and CFD derived models is provided in the table 1.

TABLE 1

Summary of the $R^2$ values for the linear fits and the coefficients of the fits for both the experimental and CFD derived models.

| | Experimental Model | | | CFD model | | |
|---|---|---|---|---|---|---|
| | $R^2$ | a | b | $R^2$ | a | b |
| 1 array diameter upstream | 1 | 0.0018 | 0.9997 | 0.92632 | 0.0036 | 1.0249 |
| 1 turbine diameter upstream | 0.99743 | 0.0062 | 0.9044 | 0.96961 | 0.0168 | 1.0968 |

TABLE 1-continued

Summary of the R² values for the linear fits and the coefficients of the fits for both the experimental and CFD derived models.

|  | Experimental Model | | | CFD model | | |
|---|---|---|---|---|---|---|
|  | $R^2$ | a | b | $R^2$ | a | b |
| 1 turbine diameter downstream | 0.99984 | −0.0062 | 0.993 | 0.92609 | −0.0098 | 0.9353 |
| 1 array diameter downstream | 1 | −0.0018 | 0.9984 | 0.84571 | −0.0022 | 0.9772 |

Figure 14:
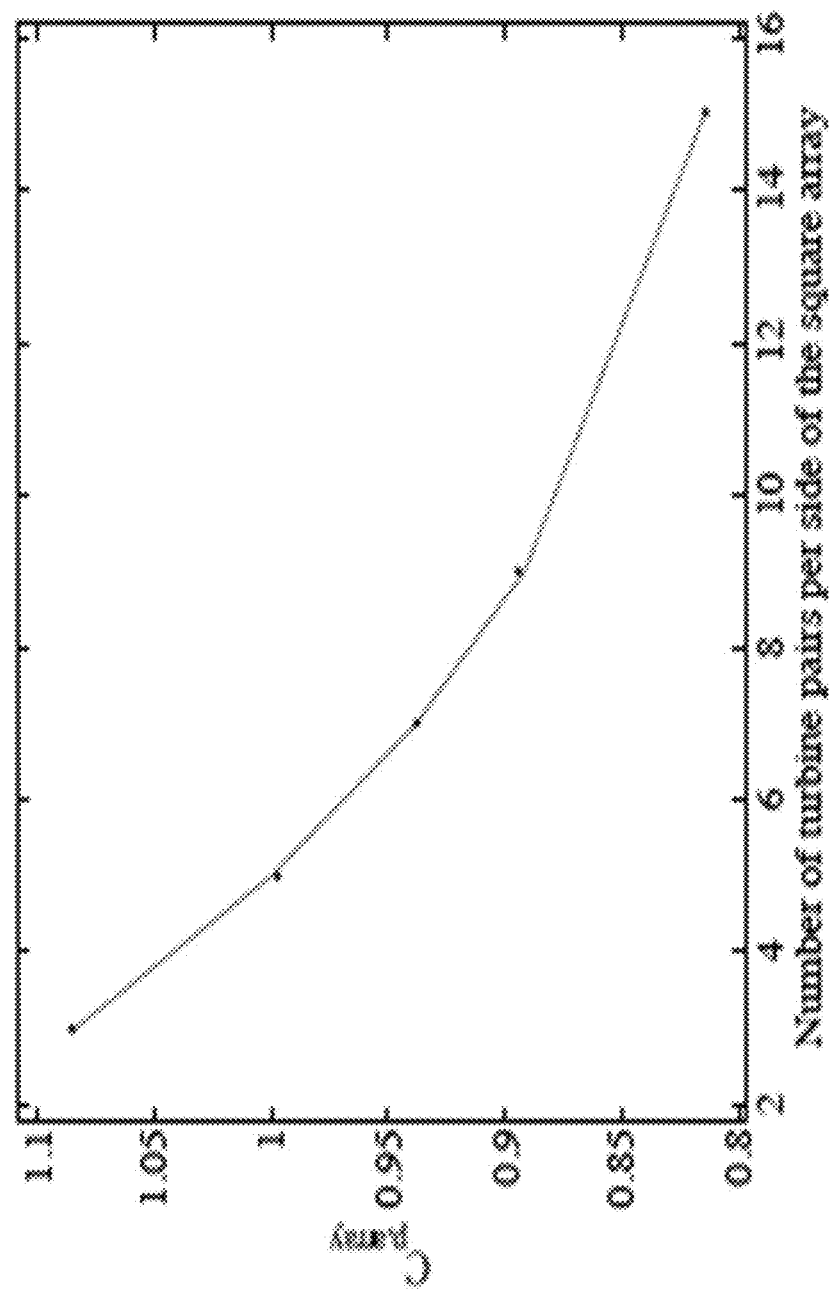
FIG. 14 shows a plot comparing $C_{p,array}'$ values for square arrays of counter-rotating turbine pairs using a CFD model.

It is difficult to tell from these data if the overall $C_{p,array}'$ will increase or decrease. However, using the CFD model the computation of $C_{p,array}'$ for large arrays becomes possible. In this example, arrays of size 3×3, 5×5, 7×7, 9×9, and 15×15 were examined. It can be seen from FIG. 14 that the value of $C_{p,array}'$ decreases exponentially with the size of the array. The trendline fit was of the form $y=a-be^{-cx}$. The coefficients were found to be a=0.7635, b=−0.5076, and c=0.1527. The $R^2$ value of the fitting was 0.9997. At present it is unknown if it is possible to extract this information from the centerline trend data only.

The CFD model was then also used in a program seeking to optimize a turbine array subject to the same constraints as the corresponding optimization using the experimental model. For this optimization, the strengths of the potential flow elements were taken to be homogenous throughout the array, but the contribution of every element in the array was computed for each test point. Using the CFD model yielded the same optimized array as the experimental model. Note that the model units used included 4 clockwise rotating turbine pairs, 4 counter-clockwise rotating turbine pairs, and 1 clockwise/counter-clockwise counter-rotating turbine pair. The computed $C_{p,array}'$ of using the CFD model was 1.5903 at the optimized incoming wind direction. The improvement predicted by the CFD model is therefore about half that predicted by the experimental model. There were also several other arrangements of turbines that were found to have performance improvements of very similar magnitude. At present, the discrepancy between the predicted improvements from the two models is unknown although it is hypothesized that the difference is due to the inclusion or exclusion of downstream effects.

Figure 15:
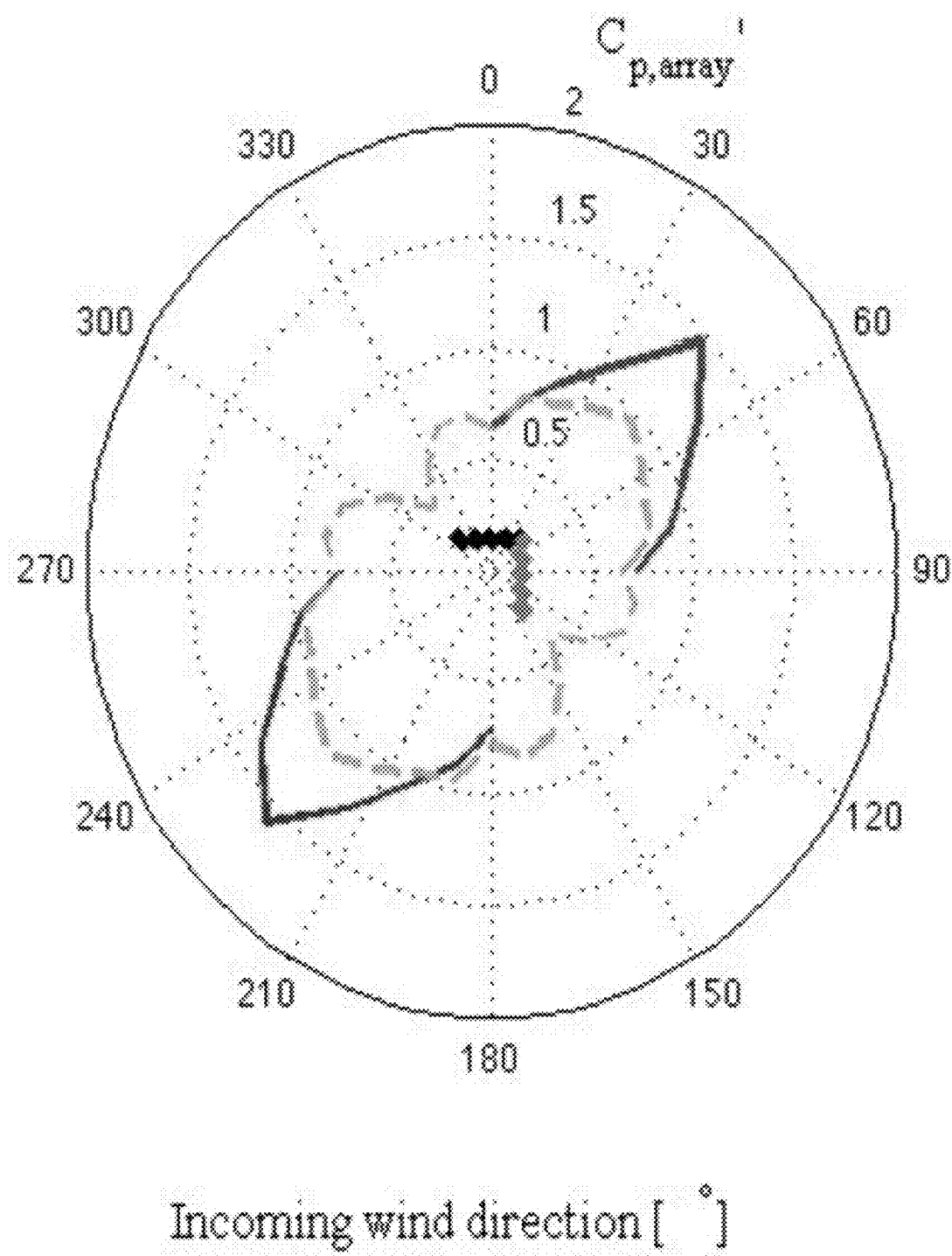
FIG. 15 shows diagram of the performance of array optimized according to methods herein described for single flow direction over a range of flow directions. The circumferential axis is the angle in degrees from which the flow is coming. The radial axis is the value of $C_{p,array}'$ attained by the array when the flow is in the specified direction. The solid line indicates the values computed using turbine pair models, the dashed line indicates value computed using single turbine models. The black turbines are clockwise rotating, the gray turbines are counter-clockwise rotating.

How the array would perform when the wind was not incoming from the optimized direction was considered here again in this example. It was discovered that some of the potential flow elements in the turbine pair models were very close to lying exactly between the two turbines. Thus, when the potential flow elements were rotated around this center in order to account for the wind incoming from different directions, these elements stayed in approximately the same place and the test points taken to determine the flow into the turbines came very close to these points. The net result was that the potential flow computed at these points was unrealistically high or low. Therefore, in order to evaluate the performance of the array when the test points were between two turbines in a pair (i.e. when one turbine of a pair was in the wake of the other turbine in the pair), the models were switched from using the turbine pair models to using the single turbine models. The results of this analysis are shown in FIG. 15. It is noted that the nonlinear effects captured in the pair models are important in this example since the $C_{p,array}'$ values predicted by the single turbine models are substantially smaller than those predicted by the pair models in these examples. This also indicates that for the wind directions at which the pair models could not be used, the $C_{p,array}'$ values are more likely to be an underestimate rather than an overestimate. Although not as substantial as the increases seen in performance predicted by the experimental model, nevertheless there is improvement over a range of approximately 60° around the optimization angle and another peak again of approximately 60° width at the opposite direction of optimized angle.

Figure 16A:
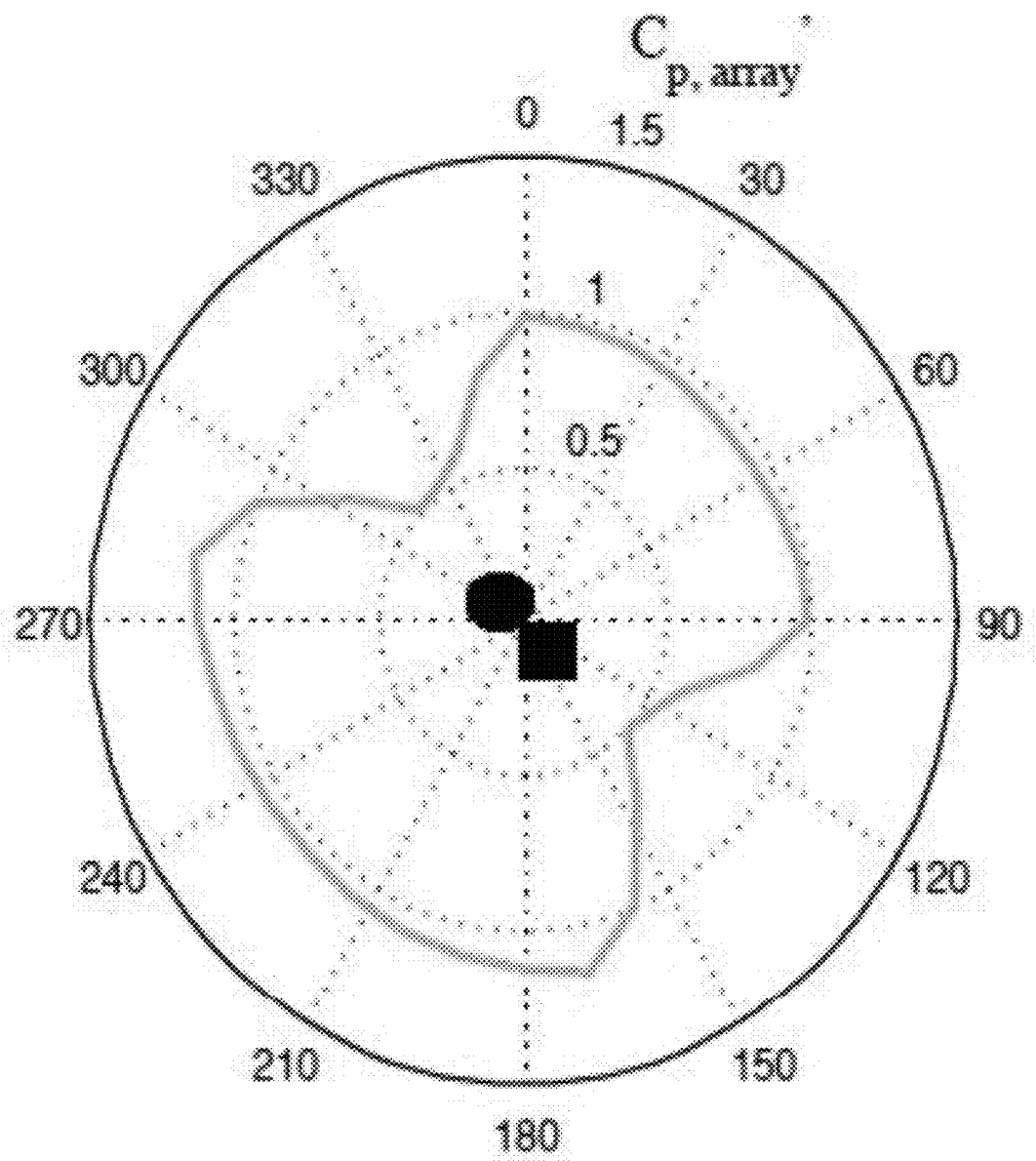
FIG. 16A shows a diagram showing $C_{p,array}'$ as a function of incoming wind direction for a counter-rotating turbine pair. Solid circles represent counter-clockwise rotating turbines; solid squares represent clockwise rotating turbines.
Figure 16B:
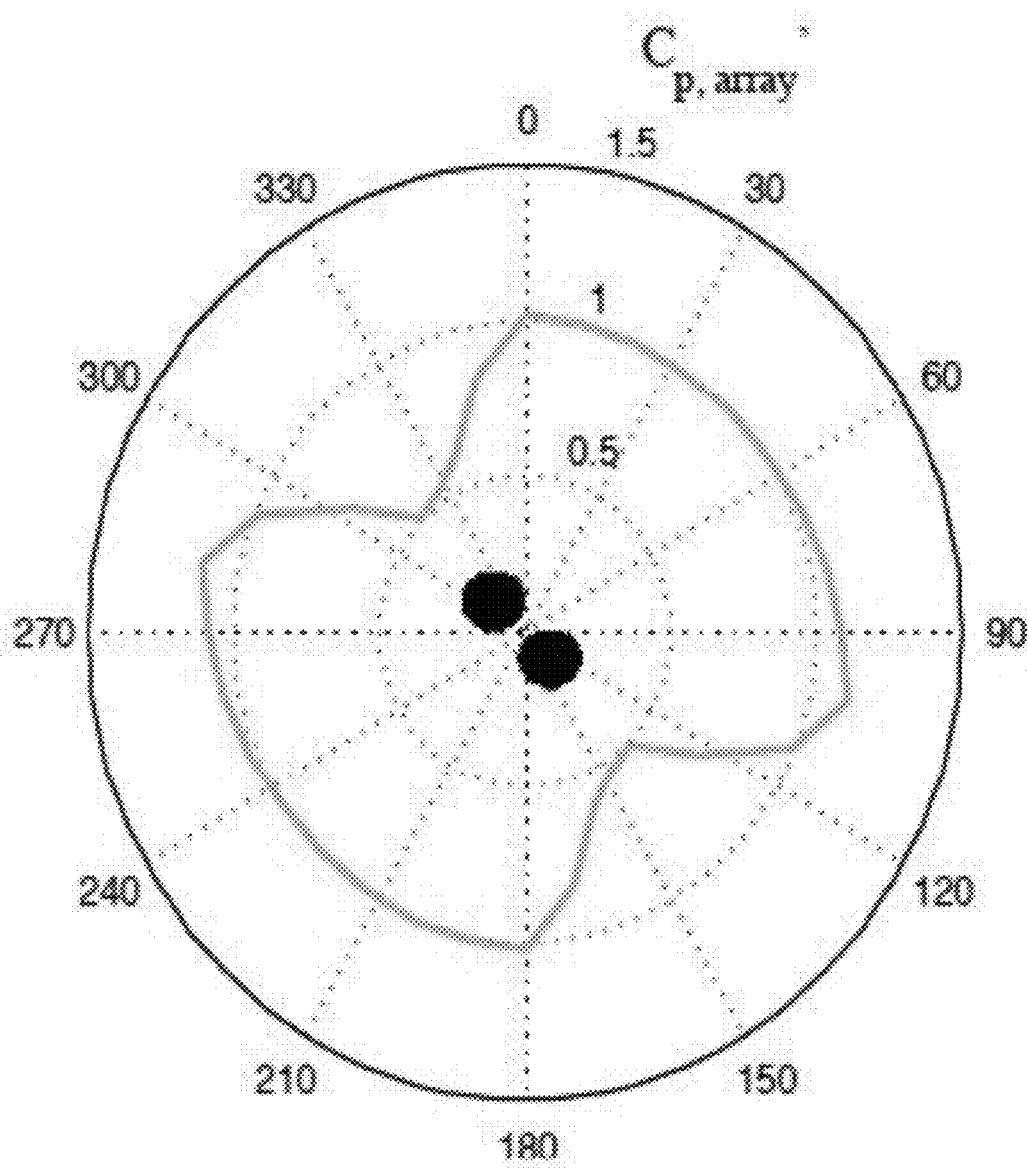
FIG. 16B shows a diagram showing $C_{p,array}'$ as a function of incoming wind direction for a co-rotating turbine pair of counter-clockwise rotating turbines. Solid circles represent counter-clockwise rotating turbines.
Figure 17:
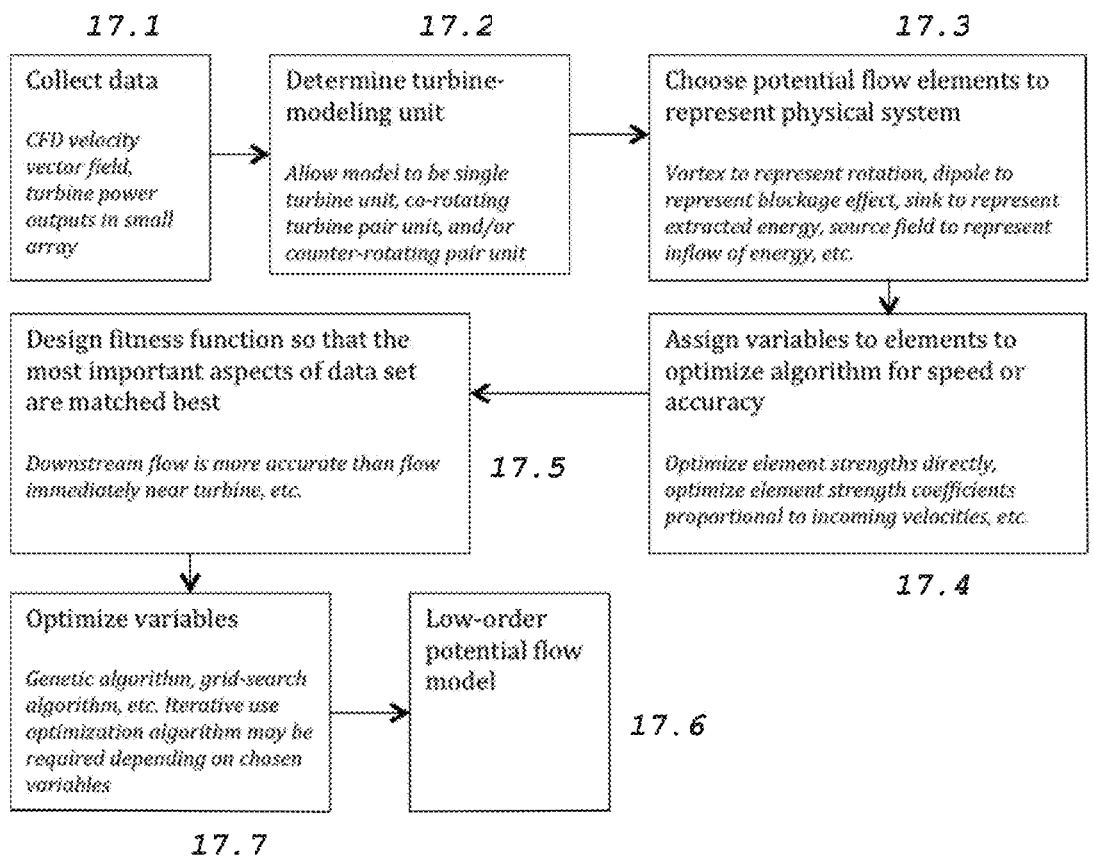
FIG. 17 shows a flow diagram comprising steps for performing the method of providing a low-order potential flow model of a vertical axis wind turbine (VAWT) according to embodiments of the disclosure.
Figure 18:
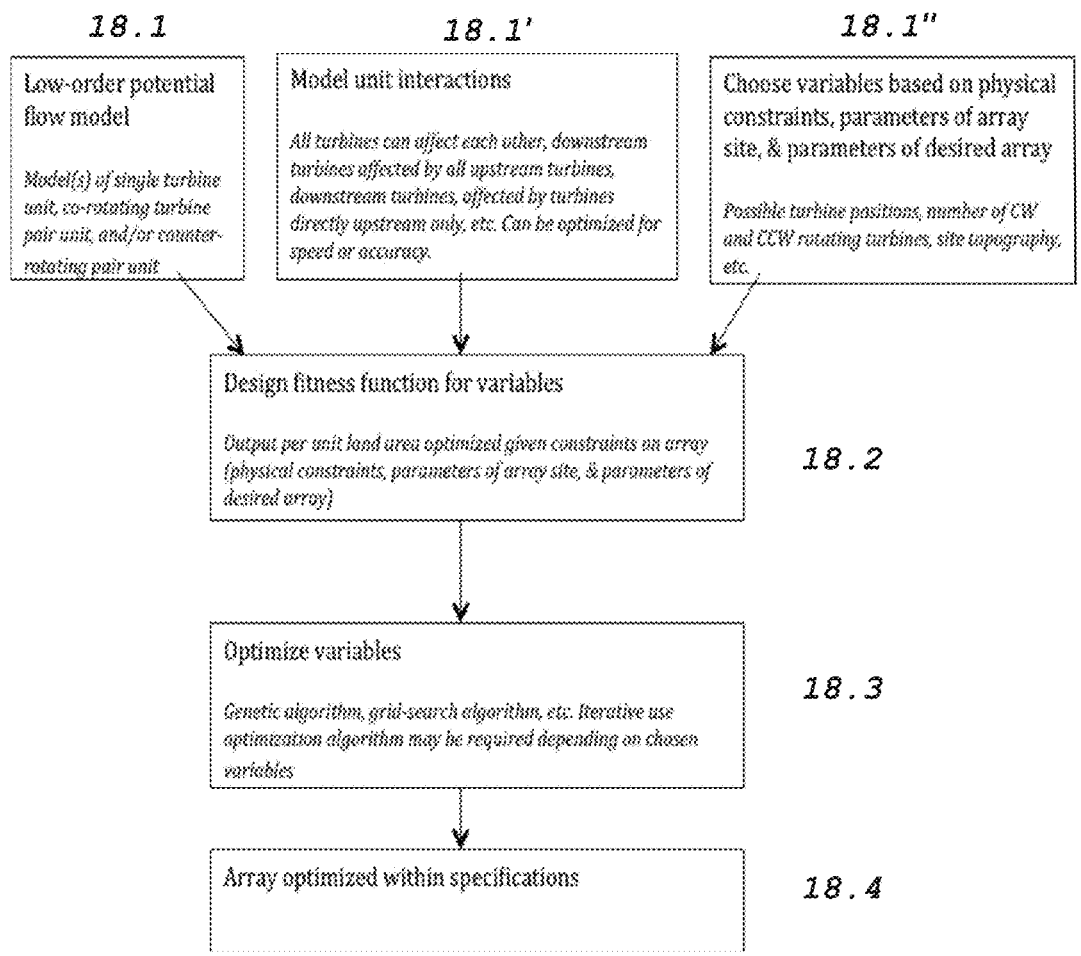
FIG. 18 shows a flow diagram comprising steps for performing the method of configuring an array of vertical axis wind turbines (VAWTs) for an array site according to embodiments of the disclosure.

As a check on these results, the directional flow analysis around a single co-rotating pair and a single counter-rotating pair using the single turbine models was completed. As expected, there was symmetry around the centerline in the counter-rotating case with the flow into the turbines from the optimized direction being better than the flow from opposite direction. Similarly, there was an inverted symmetry around the centerline of co-rotating turbine pair. The plots of these results are given in FIG. 16.

Examples 1-8

Summary

The examples above show an implementation of embodiments of the low order potential flow model of the cross-section of a vertical axis wind turbine described herein which can be used to predict and optimize the power outputs of large arrays of such turbines. In these examples, the potential flow models have been optimized both for a set of experimental data and for a set of CFD data.

The CFD modeling procedure, in particular, can be extended to model turbines of substantially any geometry. The experimental based model can be extended to model turbines in any array for which the power output of the turbines is known. In some cases, knowledge of the velocities within the current array is also known. Furthermore, since the elements of the potential flow model can have physical interpretations, performances of arrays with arbitrary turbines can be correlated and predicted, given information on how that turbine physically compares with known turbines (e.g. more blades can correspond to a higher dipole value since there can be more flow blockage).

The two models were used in these examples to empirically determine the scaling laws for the velocities associated with large arrays of equally spaced counter-rotating pairs of turbines. It is predicted that the velocities in front the arrays will increase linearly, while the velocities behind the arrays will decrease linearly. However, comparison of the $C_{p,array}'$ values computed using the CFD derived model indicates that there will be an exponential decrease in the value of $C_{p,array}'$ as the number of turbines in the array increases.

Both models were also used in order to predict an optimal arrangement given the physical parameters of the field array currently in use and assuming a single prevalent wind direction. The result from both models was in the form of a large 'V' open to the incoming wind direction. In this arrangement, a minimal number of turbines are directly in the wakes of other turbines and it is believed that, in potential flow terms, vortex sheets of turbines are created on either side of the V in order to effectively channel the incoming wind. The two models predicted different values for the improvement to performance obtained by this arrangement over the performance obtained by the same number of spatially isolated turbines. It is noted that the optimization program used for both programs is readily modified to allow optimization of arrays with essentially arbitrary physical parameters.

The examples set forth above are provided to give those of ordinary skill in the art a complete disclosure and description of how to make and use the embodiments of the methods and systems for comparing wind turbine arrays and providing configurations thereof of the disclosure, and are not intended to limit the scope of what the inventors regard as their disclosure. Modifications of the above-described modes for carrying out the disclosure can be used by persons of skill in the art, and are intended to be within the scope of the following claims.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

LIST OF REFERENCES

1. J. F. Ainslie. Calculating the flow field in the wake of wind turbines. *Journal of Wind Engineering and Industrial Aerodynamics,* 27: 213-224, 1988.
2. I. M. Asher, M. Drela, and J. Peraire. A low order model for vertical axis wind turbines. In 28$^{th}$ AIAA Applied Aerodynamics Conference. *American Institute of Aeronautics and Astronautics,* 2010.
3. Data Services AWEA. AWEA U.S. Wind Industry first quarter 2012 market report. Technical report, American Wind Energy Association, March 2012.
4. Marc Calaf, Charles Meneveau, and Johan Meyers. Large eddy simulation study of fully developed wind-turbine array boundary layers. *Physics of Fluids,* 22 (015110), 2010.
5. J. O. Dabiri. Potential order-of-magnitude enhancement of wind farm power density via counter rotating vertical-axis wind turbine arrays. *Journal of Renewable and Sustainable Energy,* 3, 2011.
6. E. Hau. Wind Turbines: Fundamentals, Technologies, Application, Economics. Springer, 2nd edition, 2005.
7. M. Islam, D. S. K. Ting, and A. Fartaj. Aerodynamic models for darrieus-type straight-bladed vertical axis wind turbines. *Renewable and Sustainable Energy Reviews,* 12:1087-1109, 2008.
8. B. G. Newman. Actuator-disc theory for vertical axis wind turbines. *Journal of Wind Energy and Industrial Aerodynamics,* 15:347-355, 1983.
9. H. Pohlheim. GEATBX®—the genetic and evolutionary algorithm toolbox for MATLAB®, 2007. URL http://www.geatbx.com/. Last access: Jun. 24, 2012.
10. P. N. Shankar. Development of vertical axis wind turbines. *Proceedings of the Indian Academy of Science,* C 2(1):49-66, 1979.
11. B. Sorensen. Renewable Energy: Its physics, engineering, environmental impacts, economics & planning. Academic Press, 2000.
12. K. Taira and T. Colonius. The immersed boundary method: a projections approach. *Journal of Computational Physics,* 225: 2118-2137, 2007.
13. The MathWorks Inc. R2012a, documentation for global optimization toolbox. URL http://www.mathworks.com/help/toolbox/gads/f6187.html. Last access: Jun. 24, 2012.
14. L. J. Vermeer, J. N. Sorensen, and A. Crespo. Wind turbine wake aerodynamics. *Progress in Aerospace Sciences,* 39:467-510, 2003.
15. R. W. Whittlesey, S. Liska, and J. O. Dabiri. Fish schooling as a basis for vertical axis wind turbine farm design. *Bioinspiration & Biomimetics,* 5:035005, 2010.
16. R. Wiser and M. Bolinger. 2010 wind technologies market report. Technical report, U.S. Department of Energy: Energy Efficiency & Renewable Energy, 2011.

What is claimed is:

1. A computer-implemented method of configuring an array of vertical axis turbines for an array site, the method comprising:
   executing, using one or more computer systems, executable instructions to perform at least the steps of
   receiving input data corresponding to potential flow around one or more of a selected vertical axis turbine;
   receiving input variables, the input variables being parameters of the array site and of the vertical axis turbine, the parameters comprising:
   dimensional constraints of the array site,
   physical characteristics of the vertical axis turbines,
   non dimensional constraints of the array site,
   number of the vertical axis turbines,
   chirality of the vertical axis turbines,
   a turbulent energy source field consisting of fluid flow, other than crossflow, coming from above the array of vertical axis turbines, and
   power output constraints of the vertical axis turbine;
   estimating a fluid flow in the array of vertical axis turbines, based on the input variables;
   setting one or more set thresholds according to a desired attribute of a configured array site;
   ranking configurations of array sites based on the parameters, according to a fitness function based on the one or more set thresholds;
   calculating an optimal site for each vertical axis turbine of the array of vertical axis turbines according to the desired attribute of the configured array site, wherein the calculating, an optimal site is based on a grid-search algorithm, a genetic algorithm, or a gradient-based algorithm, and is further based on the parameters and on the ranking configurations; and
   positioning each vertical axis turbine of the array according to the calculated optimal sites.

2. The method according to claim 1, wherein the vertical axis turbine is a wind turbine.

3. The method according to claim 1, wherein the vertical axis turbine is a wind turbine and the parameters further comprise: an incoming wind direction, an incoming wind speed, and topography of the turbine array site.

4. The method according to claim 1, wherein the vertical axis turbine Is an underwater turbine.

5. The method according to claim 1, wherein the desired attribute of a configured array site is power output.

6. The method according to claim 1, wherein the estimating comprises calculating fluid flow elements, the fluid flow elements comprising:
- at least one vortex element for a rotation of each vertical axis turbine,
- at least one dipole element for a drag of each vertical axis turbine, and
- at least one sink element for a power output of each vertical axis turbine.

7. The method according to claim 6, wherein:
- a strength of the at least one vortex element is proportional, through a first constant, to a cube power function of the velocity of the fluid flow incoming on the vertical axis turbine,
- a strength of the at least one dipole element is proportional, through a second constant, to the cube power function of the velocity of the fluid flow incoming on the vertical axis turbine, and
- a strength of the at least one sink element is proportional, through a third constant, to a square power function of the velocity of the fluid flow incoming on the vertical axis turbine.

8. The method according to claim 7, wherein the estimating further comprises optimizing the first, second, and third constants.

9. The method according to claim 8, wherein the estimating further comprises iterating over a strength of each fluid flow element and the fluid flow incoming on each vertical axis turbine.

10. The method according to claim 1, wherein the turbulent energy source field comprises a plurality of single turbulent energy sources, each of the single energy sources having the form $$F = \frac{q}{2\pi}\ln(z - z_0)$$

$$W = \frac{q}{2\pi(z - z_0)}$$

where F Is a complex potential, $W = dF/dz$, q is a strength of a single turbulent energy source, z is a point in a complex plane at which a flow is being evaluated, and $z_0$ is a location in the complex plane of the single turbulent energy source.

11. The method according to claim 1, further comprising calculating a beneficial contribution of the turbulent energy source field consisting of fluid flow, other than crossflow, coming from above the array of vertical axis turbines, and wherein the calculating an optimal site is further based on the beneficial contribution of the turbulent energy source field.

* * * * *